(12) United States Patent
Choi et al.

(10) Patent No.: US 10,720,101 B2
(45) Date of Patent: Jul. 21, 2020

(54) DISPLAY DEVICE CONFIGURED TO ADJUST EMISSION START SIGNAL BASED ON ACCUMULATION AMOUNT OF CURRENT FROM AUXILIARY PIXEL

(71) Applicant: Samsung Display Co., Ltd., Yongin-si (KR)

(72) Inventors: Sang Moo Choi, Yongin-si (KR); Jin Woo Park, Yongin-si (KR); Dong Sun Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/036,938

(22) Filed: Jul. 17, 2018

(65) Prior Publication Data
US 2019/0027093 A1 Jan. 24, 2019

(30) Foreign Application Priority Data
Jul. 19, 2017 (KR) .......................... 10-2017-0091266

(51) Int. Cl.
*G09G 3/20* (2006.01)
*G09G 3/3233* (2016.01)
(Continued)

(52) U.S. Cl.
CPC ......... *G09G 3/3233* (2013.01); *G09G 3/3258* (2013.01); *G09G 3/3266* (2013.01); *H01L 27/3265* (2013.01); *H01L 27/3276* (2013.01); *G09G 3/3291* (2013.01); *G09G 2300/0809* (2013.01); *G09G 2300/0819* (2013.01); *G09G 2300/0842* (2013.01); *G09G 2300/0861* (2013.01); *G09G 2310/0251* (2013.01); *G09G 2310/0262* (2013.01);
(Continued)

(58) Field of Classification Search
CPC ........................ H01L 27/3265; H01L 27/3276
See application file for complete search history.

(56) References Cited

U.S. PATENT DOCUMENTS 8,194,013 B2 6/2012 Choi
2006/0220578 A1* 10/2006 Park ..................... G09G 3/3225
315/169.3
(Continued)

FOREIGN PATENT DOCUMENTS

| KR | 10-0969801 | 7/2010 |
|---|---|---|
| KR | 10-1281681 | 7/2013 |
| KR | 10-1671514 | 11/2016 |

*Primary Examiner* — Lunyi Lao
*Assistant Examiner* — Kirk W Hermann
(74) *Attorney, Agent, or Firm* — H.C. Park & Associates, PLC

(57) ABSTRACT

A display device includes pixels, an auxiliary pixel, a controller, and an emission driver. The pixels are coupled to data lines and emission control lines. The auxiliary pixel is coupled to an auxiliary data line and auxiliary emission control lines. The controller is configured to measure an auxiliary current supplied from the auxiliary pixel through an auxiliary line, and to control a width of an emission start signal based on an accumulation amount of the auxiliary current. The emission driver is configured to, based on the emission start signal, supply emission control signals to the pixels and the auxiliary pixel through the emission control lines and the auxiliary emission control lines.

17 Claims, 17 Drawing Sheets

(51) Int. Cl.
    *H01L 27/32*     (2006.01)
    *G09G 3/3258*    (2016.01)
    *G09G 3/3266*    (2016.01)
    *G09G 3/3291*    (2016.01)

(52) U.S. Cl.
    CPC . *G09G 2310/0264* (2013.01); *G09G 2310/08* (2013.01); *G09G 2320/0247* (2013.01)

(56) References Cited

U.S. PATENT DOCUMENTS

| | | | |
|---|---|---|---|
| 2007/0279343 A1* | 12/2007 | Kim | G09G 3/2007 345/77 |
| 2009/0115795 A1 | 5/2009 | Pae et al. | |
| 2010/0103203 A1* | 4/2010 | Choi | G09G 3/3283 345/690 |
| 2015/0170607 A1* | 6/2015 | Shin | G09G 3/20 345/690 |
| 2016/0189620 A1* | 6/2016 | Park | G09G 3/3258 345/690 |

\* cited by examiner

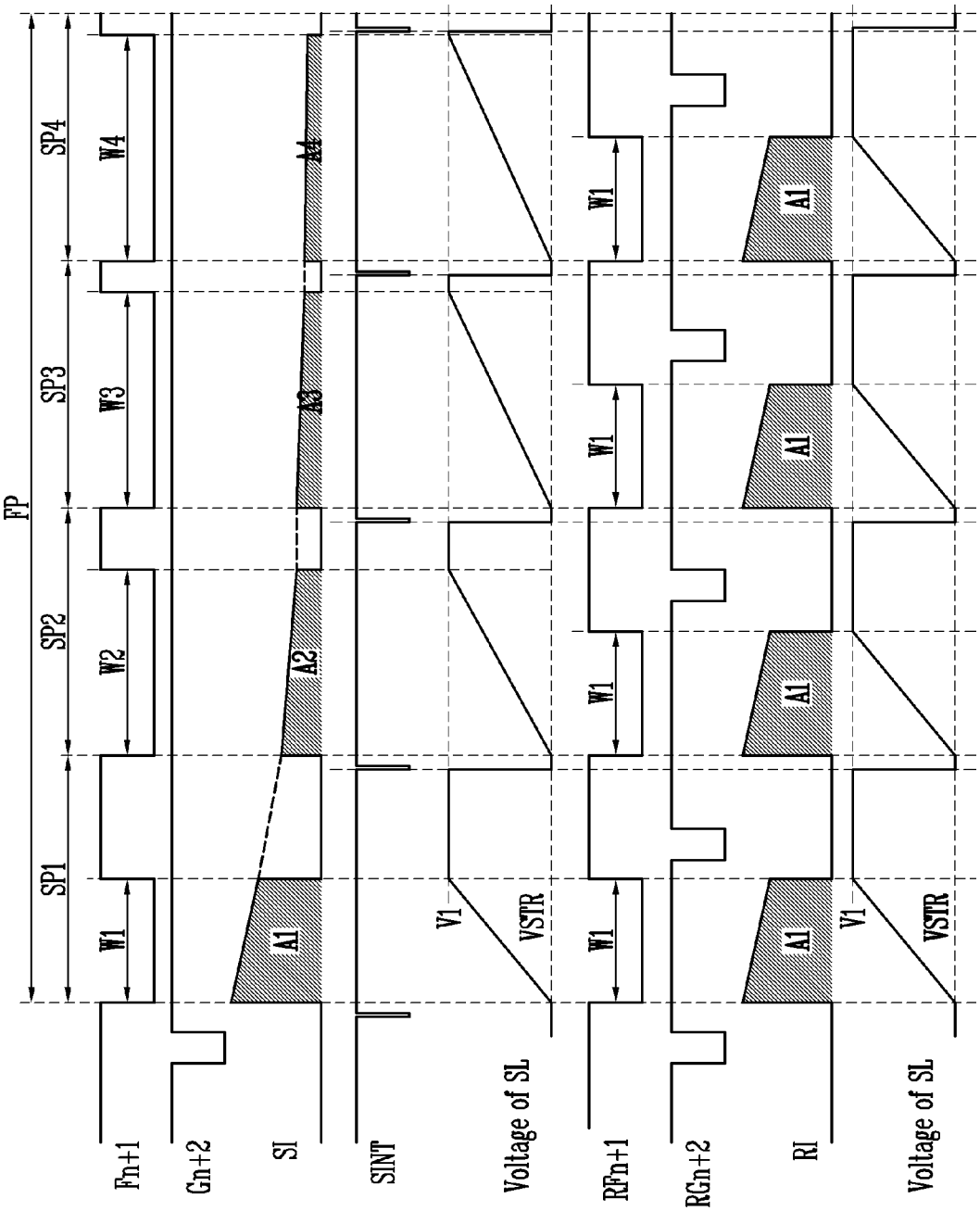

DISPLAY DEVICE CONFIGURED TO ADJUST EMISSION START SIGNAL BASED ON ACCUMULATION AMOUNT OF CURRENT FROM AUXILIARY PIXEL

CROSS-REFERENCE TO RELATED APPLICATION

This application claims priority from and the benefit of Korean Patent Application No. 10-2017-0091266, filed Jul. 19, 2017, which is hereby incorporated by reference for all purposes as if fully set forth herein.

BACKGROUND

Field

Exemplary embodiments generally relate to a display device.

Discussion

With the development of information technologies, the importance of a display device, which is a connection medium between a user and information, increases. Accordingly, display devices, such as a liquid crystal display device and an organic light emitting display device, are being increasingly used. Among these display devices, the organic light emitting display device displays images using an organic light emitting diode that generates light by recombination of electrons and holes. The organic light emitting display device has a relatively high response speed and can display a clear image. The organic light emitting display device typically includes pixels, a data driver for supplying data signals to the pixels, a scan driver for supplying scan signals to the pixels, and an emission driver for supplying emission control signals to the pixels.

The above information disclosed in this section is only for understanding the background of the inventive concepts, and, therefore, may contain information that does not form prior art.

SUMMARY

Some exemplary embodiments provide a display device capable of preventing (or reducing) a flicker phenomenon when the display device is driven in a low frequency mode.

Additional aspects will be set forth in the detailed description which follows, and, in part, will be apparent from the disclosure, or may be learned by practice of the inventive concepts.

According to some exemplary embodiments, a display device includes pixels, an auxiliary pixel, a controller, and an emission driver. The pixels are coupled to data lines and emission control lines. The auxiliary pixel is coupled to an auxiliary data line and auxiliary emission control lines. The controller is configured to measure an auxiliary current supplied from the auxiliary pixel through an auxiliary line, and to control a width of an emission start signal based on an accumulation amount of the auxiliary current. The emission driver is configured to, based on the emission start signal, supply emission control signals to the pixels and the auxiliary pixel through the emission control lines and the auxiliary emission control lines.

According to some exemplary embodiments, a display device includes pixels, an auxiliary pixel, a reference pixel, a controller, an emission driver, and a reference pixel driver. The pixels are coupled to data lines and emission control lines. The auxiliary pixel is coupled to an auxiliary data line and auxiliary emission control lines. The reference pixel is coupled to an auxiliary data line and reference emission control lines. The controller is configured to measure an auxiliary current supplied from the auxiliary pixel through an auxiliary line, to measure a reference current supplied from the reference pixel through a reference line, and to control a width of an emission start signal based on an accumulation amount of the auxiliary current and an accumulation amount of the reference current. The emission driver is configured to, based on the emission start signal, supply emission control signals to the pixels and the auxiliary pixel through the emission control lines and the auxiliary emission control lines. The reference pixel driver is configured to supply a reference emission control signal to the reference pixel through the reference emission control line.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 10B is a waveform diagram illustrating an operation of the display device of FIG. 10A according to some exemplary embodiments.

DETAILED DESCRIPTION OF THE ILLUSTRATED EMBODIMENTS

Figure 1A:
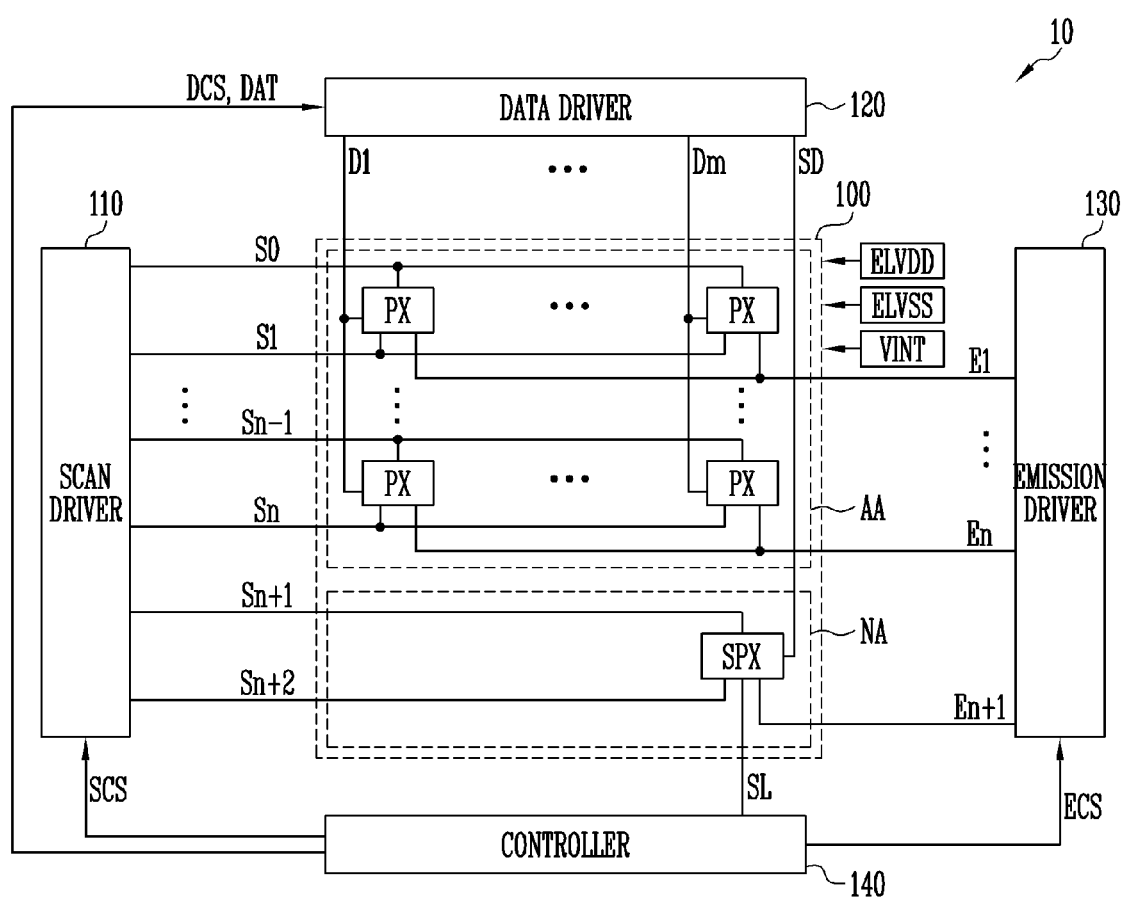
FIG. 1A is a block diagram illustrating a display device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the spirit and scope of the inventive concepts. Further, the blocks, units, and/or modules of some exemplary embodiments may be physically combined into more complex blocks, units, and/or modules without departing from the spirit and scope of the inventive concepts.

Figure 1B:
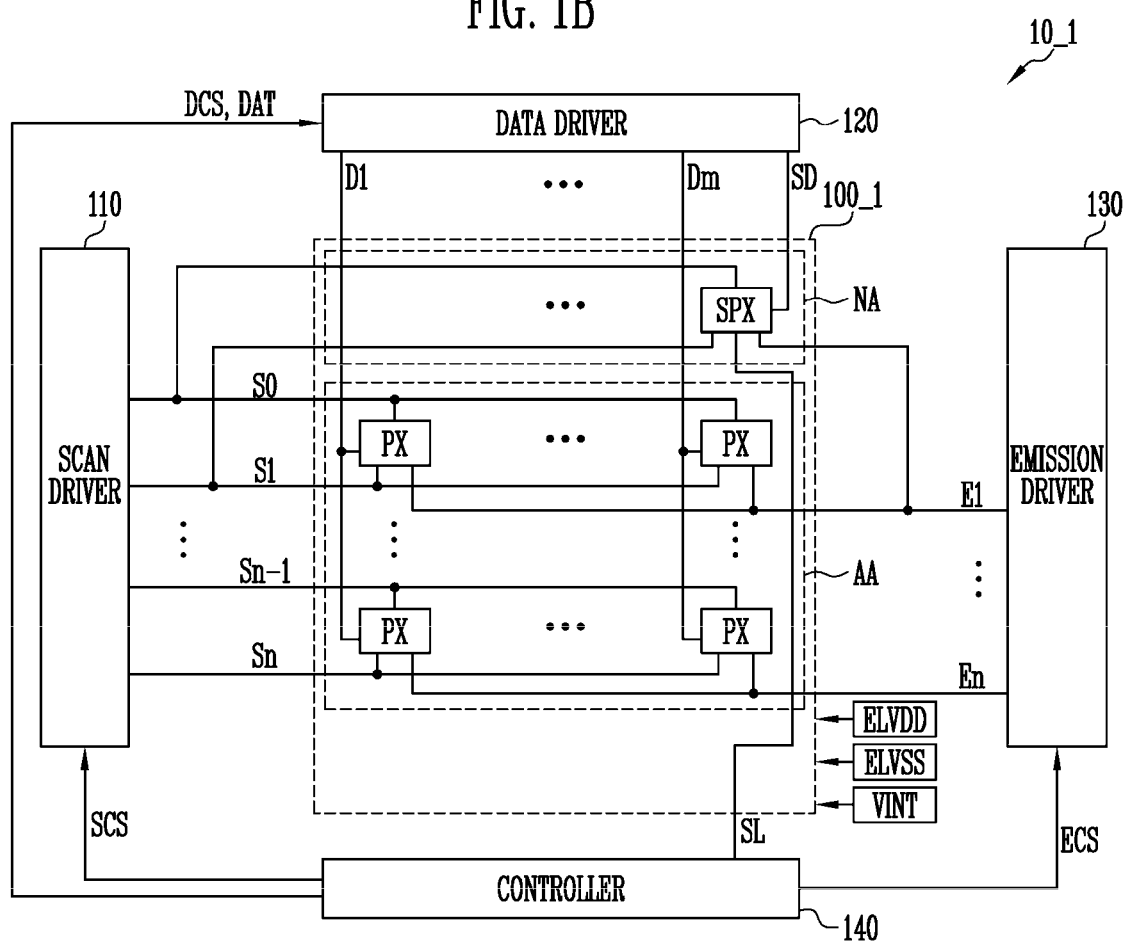
FIG. 1B is a block diagram illustrating a display device according to some exemplary embodiments.

FIG. 1A is a block diagram illustrating a display device according to some exemplary embodiments. FIG. 1B is a block diagram illustrating a display device according to some exemplary embodiments.

Referring to FIGS. 1A and 1B, the display device 10 or 10_1 may include a display unit (or panel) 100 or 100_1, a scan driver 110, a data driver 120, an emission driver 130, and a controller 140.

Hereinafter, the display device 10 or 10_1 may be driven in a specific (or determined) frequency mode. The specific frequency mode may include a low frequency mode. For example, the display device 10 or 10_1 may be driven at 10 Hz.

The display unit 100 and 100_1 may include a display region AA in which an image is displayed, and a non-display region NA in which an image is not displayed. In FIG. 1A, it is illustrated that the display region AA is located above the non-display region NA, but exemplary embodiments are not limited thereto. For instance, as shown in FIG. 1B, in some exemplary embodiments, the non-display region NA may be set at various positions, e.g., above the display region AA.

The display unit 100 and 100_1 may include pixels PX and at least one auxiliary pixel SPX. The display unit 100 and 100_1 may be coupled to a first pixel power source ELVDD, a second pixel power source ELVSS, and a third pixel power source VINT.

The pixels PX may be arranged on (or in) the display region AA. Also, the pixels PX may be arranged in a matrix form. The pixels PX may be coupled to data lines D1 to Dm (m being a natural number), scan lines S0 to Sn (n being a natural number), and emission control lines E1 to En. For example, the pixels PX may be formed at positions at which the data lines D1 to Dm, the scan lines S0 to Sn, and the emission control lines E1 to En intersect one another.

The pixels PX may be supplied with data signals, scan signals, and emission control signals through the data lines D1 to Dm, the scan lines S0 to Sn, and the emission control lines E1 to En. For instance, the pixels PX may be supplied with scan signals from the scan lines S0 to Sn, and may be supplied with data signals synchronized with the scan signals from the data lines D1 to Dm. The pixels PX supplied with the data signals may control an amount of driving current flowing from the first pixel power source ELVDD to the second pixel power source ELVSS via an organic light emitting diode (not shown). In this case, the organic light emitting diode may generate light with a luminance corresponding to the amount of driving current.

According to some exemplary embodiments, each of the pixels PX may be coupled to a plurality of scan lines among scan lines S0 to Sn. In some exemplary embodiments, each of the pixels PX may be coupled to a "current" scan line and a "previous" scan line. For example, pixels PX located on an i-th horizontal line may be coupled to an i-th scan line Si and an (i−1)-th scan line Si−1.

The auxiliary pixel SPX may be disposed on (or in) the non-display region NA. The auxiliary pixel SPX may be coupled to an auxiliary data line SD. The auxiliary pixel SPX may be coupled to arbitrary scan lines and arbitrary emission control lines. For example, as shown in FIG. 1A, in some exemplary embodiments, the auxiliary pixel SPX may be coupled to scan lines Sn+1 and Sn+2 or an auxiliary scan line, and an emission control line En+1 or an auxiliary emission control line. As shown in FIG. 1B, in some exemplary embodiments, the auxiliary pixel SPX may be coupled to scan lines S0 and S1 and an emission control line E1. However, exemplary embodiments are not limited thereto. For instance, the auxiliary pixel SPX may be coupled to any one of the scan lines S0 to Sn coupled to the pixels PX and any one of the emission control lines E1 to En. For descriptive and illustrative convenience, the display device and an operating method of the display device will, hereinafter, be described based on the display device 10 of FIG. 1A; however, the configuration and operating method may be applied to the display device 10_1 of FIG. 1B.

The auxiliary pixel SPX may be formed at a position at which the auxiliary data line SD, the scan lines Sn+1 and Sn+2, and the emission control line En+1 intersect one another. The auxiliary pixel SPX may be supplied with an auxiliary data signal, scan signals, and an emission control signal through the auxiliary data line SD, the scan lines Sn+1 and Sn+2, and the emission control line En+1. The auxiliary pixel SPX may be supplied with scan signals from the scan lines Sn+1 and Sn+2, and be supplied with an auxiliary data signal synchronized with the scan signals from the auxiliary data line SD. The auxiliary pixel SPX may supply an auxiliary current based on the auxiliary data signal. That is, the auxiliary pixel SPX may control an amount of auxiliary current.

According to some exemplary embodiments, the auxiliary pixel SPX may be coupled to a plurality of scan lines. In some exemplary embodiments, the auxiliary pixel SPX may be coupled to a "current" scan line and a "previous" scan line. For example, the auxiliary pixel SPX may be coupled to an (n+1)-th scan line Sn+1 and an (n+2)-th scan line Sn+2.

The scan driver 110 may supply scan signals to the scan lines S0 to Sn+2 corresponding to a driver control signal SCS supplied from the controller 140. In some exemplary embodiments, the scan driver 110 may supply the scan signals to the plurality of scan lines S0 to Sn+2 for every frame period FP (see FIG. 2B). For example, the scan driver 110 may sequentially supply a plurality of scan signals to the plurality of scan lines S0 to Sn+2.

If the plurality of scan signals are sequentially supplied to the plurality of scan lines S0 to Sn+2, the pixels PX and the auxiliary pixel SPX may be sequentially selected in units of horizontal lines. In this case, a scan signal may have a voltage level at which a transistor supplied with the scan signal can be turned on. That is, the scan signal may have (or provide) a gate-on voltage.

The data driver 120 may supply a plurality of data signals to the plurality of data lines D1 to Dm corresponding to a data driver control signal DCS. In some exemplary embodiments, the data driver 120 may supply data signals corresponding to gray levels to the data lines D1 to Dm. The data driver 120 may supply an auxiliary data signal corresponding to a certain (or determined) voltage to the auxiliary data line SD. The magnitude of the auxiliary data signal may be previously determined by the data driver 120 or the controller 140.

The data signals supplied to the data lines D1 to Dm may be supplied to pixels PX selected by each scan signal. To this end, the data driver 120 may supply data signals to the data lines D1 to Dm in synchronization with the scan signals. In addition, the data driver 120 may supply an auxiliary data signal to the auxiliary data line SD corresponding to the data driver control signal DCS.

The auxiliary data signal supplied to the auxiliary data line SD may be supplied to the auxiliary pixel SPX. To this end, the data driver 120 may supply an auxiliary data signal to the auxiliary data line SD in synchronization with the scan signals.

The emission driver 130 may supply a plurality of emission control signals to a plurality of emission control lines E1 to En+1 based on an emission driver control signal ECS supplied from the controller 140. The emission driver control signal ECS may include an emission start signal FLM (see FIGS. 4A and 4B).

For example, the emission driver 130 may sequentially supply the plurality of emission control signals to the plurality of emission control lines E1 to En+1 based on the emission start signal FLM. In this case, the emission control signal may have a voltage level at which a transistor supplied with the emission control signal can be turned on. That is, the emission control signal may have (or provide) the gate-on voltage.

The emission driver 130 may supply emission control signals for every sub-period included in one frame period. The width of the emission control signals may be changed for each of a plurality of sub-periods. For example, the width of the emission control signals may be set to increase corresponding to a supply order. That is, the width of the emission control signals may increase from an initial sub-period to a last sub-period. This will be described in detail with reference to FIGS. 2B and 3B.

The controller 140 may generate the scan driver control signal SCE, the data driver control signal DCS, and the emission driver control signal ECS corresponding to control signals supplied from an outside source. In this case, the scan driver control signal SCS may be supplied to the scan driver 110, the data driver control signal DCS may be supplied to the data driver 120, and the emission driver control signal ECS may be supplied to the emission driver 130. In addition, the controller 140 may convert image data input from the outside source into image data DAT suitable for specifications of the data driver 120, and supply the image data DAT to the data driver 120.

The scan driver control signal SCS may include a scan start signal and clock signals. The scan start signal may control supply timings of scan signals, and the clock signals may be used to shift the scan start signal.

The emission driver control signal ECS may include an emission start signal FLM (see FIGS. 4A and 4B) and clock signals. The emission start signal FLM may control a supply timing of an emission control signal, and the clock signals may be used to shift the emission start signal FLM.

The data driver control signal DCS may include a source start signal, a source output enable signal, a source sampling clock, and the like. The source start signal may control a data sampling start time of the data driver 120. The source sampling clock may control a sampling operation of the data driver 120 based on a rising or falling edge. The source output enable signal may control an output timing of the data driver 120.

The controller 140 may be coupled to the auxiliary pixel SPX through an auxiliary line SL. The controller 140 may measure an auxiliary current supplied from the auxiliary pixel SPX. In some exemplary embodiments, the operation in which the controller 140 measures the auxiliary current may include an operation in which the controller 140 senses a voltage formed by the flow of the auxiliary current.

The controller 140 may generate the emission driver control signal ECS supplied to the emission driver 130 based on an accumulation amount of the measured auxiliary current. For example, the controller 140 may control the width (or duty ratio) of the emission start signal FLM based on the accumulation amount of the measured auxiliary current.

According to some exemplary embodiments, the display device 10 may further include a voltage generator (not shown). The display unit 100 may be provided with the first pixel power source ELVDD, the second pixel power source ELVSS, and the third pixel power source VINT from the voltage generator. In this case, the third pixel power source VINT may be set to have a voltage lower than that of the data signal. For example, the third pixel power source VINT may be set such that the organic light emitting diode does not emit light.

Although FIG. 1A illustrates n+3 scan lines S0 to Sn+2 and n+1 emission control lines E1 to En+1 being provided, exemplary embodiments are not limited thereto. For instance, in some exemplary embodiments, dummy scan lines and/or dummy emission control lines may be additionally formed so as to achieve more stable driving of the pixels.

Also, although FIG. 1A illustrates the scan lines Sn+1 and Sn+2 coupled to one auxiliary pixel SPX, one auxiliary data line SD, and one auxiliary pixel SPX being provided, exemplary embodiments are not limited thereto. For instance, the display device 10 may further include a plurality of auxiliary pixels arranged in the non-display region NA, a plurality of auxiliary data lines that supply an auxiliary data signal to the plurality of auxiliary pixels, and a plurality of scan lines coupled to only the plurality of auxiliary pixels.

Further, although FIGS. 1A and 1B illustrate the scan driver 110, the data driver 120, the emission driver 130, and the controller 140 being individually provided, exemplary embodiments are not limited thereto. For instance, at least two of the scan driver 110, the data driver 120, the emission driver 130, and the controller 140 may be integrated.

The scan driver 110, the data driver 120, the emission driver 130, and the controller 140 may be installed in various ways including, for example, chip-on-glass, chip-on-plastic, tape carrier package, chip-on-film, and the like.

Figure 2A:
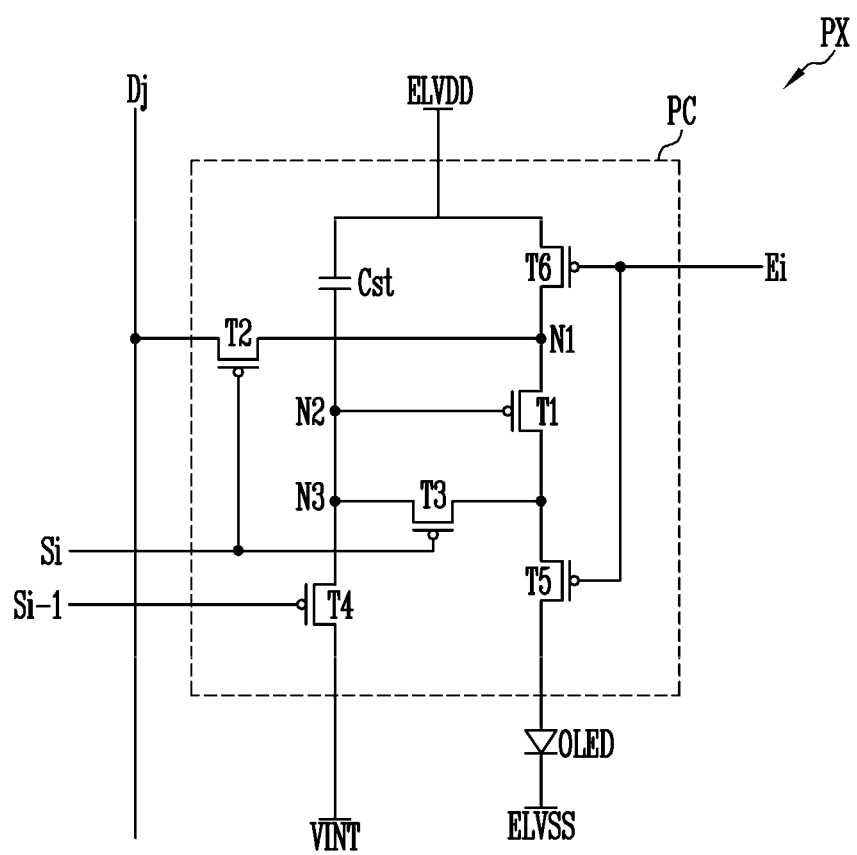
FIG. 2A is a circuit diagram illustrating a pixel according to some exemplary embodiments.

FIG. 2A is a circuit diagram illustrating a pixel according to some exemplary embodiments. For descriptive and illustrative convenience, a pixel PX coupled to an i-th (i being a natural number) emission control line Ei and a j-th (j being a natural number) data line Dj is illustrated in FIG. 2A.

Referring to FIG. 2A, the pixel PX may include a pixel circuit PC and an organic light emitting diode OLED. An anode electrode of the organic light emitting diode OLED may be coupled to the pixel circuit PC, and a cathode electrode of the organic light emitting diode OLED may be coupled to the second pixel power source ELVSS. The organic light emitting diode OLED may generate light with a predetermined luminance corresponding a driving current supplied from the pixel circuit PC. The first pixel power source ELVDD may be set to a voltage higher than that of the second pixel power source ELVSS such that a current can flow through the organic light emitting diode OLED.

The pixel circuit PC may control an amount of driving current flowing from the first pixel power source ELVDD to the second pixel power source ELVSS via the organic light emitting diode OLED corresponding to a data signal. To this end, the pixel circuit PC may include a first transistor T1, a second transistor T2, a third transistor T3, a fourth transistor T4, at least one emission transistor, and a storage capacitor Cst.

A first electrode of the first transistor (i.e., a driving transistor) T1 may be coupled to the first node N1, and a second electrode of the first transistor T1 may be coupled to a first electrode of a fifth transistor T5. In addition, a gate electrode of the first transistor T1 may be coupled to the second node N2. The first transistor T1 may control the amount of driving current flowing from the first pixel power source ELVDD to the second pixel power source ELVSS via the organic light emitting diode OLED corresponding to a data signal supplied to the j-th data line Dj.

The second transistor T2 may be coupled between the j-th data line Dj and the first node N1. In other words, the second transistor T2 may be coupled between the first electrode of the first transistor T1 and the j-th data line Dj. In addition, a gate electrode of the second transistor T2 may be coupled to an i-th scan line Si. The second transistor T2 may be turned on when a scan signal is supplied to the i-th scan line Si to allow the j-th data line Dj and the first node N1 to be electrically coupled to each other.

The third transistor T3 may be coupled between the second electrode of the first transistor T1 and a third node N3, which is coupled between the second node N2 and the fourth transistor T4. In other words, the third transistor T3 may be coupled between the gate electrode of the first transistor T1 and the second electrode of the first transistor T1. In addition, a gate electrode of the third transistor T3 may be coupled to the i-th scan line Si. The third transistor T3 may be turned on when the scan signal is supplied to the i-th scan line Si to allow the first transistor T1 to be diode-coupled.

The fourth transistor T4 may be coupled between the third node N3, which is connected to the second node N2, and the third pixel power source VINT. In other words, the fourth transistor T4 may be coupled between the gate electrode of the first transistor T1 and the third pixel power source VINT. In addition, a gate electrode of the fourth transistor T4 may be coupled to an (i−1)-th scan line Si−1. The fourth transistor T4 may be turned on when a scan signal is supplied to the (i−1)-th scan line Si−1 to supply the voltage of the third pixel power source VINT to the second node N2.

The emission transistor may be located on a path of driving current, and may be configured to allow the driving current to flow corresponding to an emission control signal supplied from the i-th emission control line Ei. For example, the emission transistor may include the fifth transistor (e.g., a first emission control transistor) T5 and a sixth transistor (e.g., a second emission control transistor) T6.

The fifth transistor T5 may be coupled between the second electrode of the first transistor T1 and the anode electrode of the organic light emitting diode OLED. In addition, a gate electrode of the fifth transistor T5 may be coupled to the i-th emission control line Ei. The fifth transistor T5 may be turned off when the emission control signal is supplied to the i-th emission control line Ei, and may be turned on when the emission control signal is not supplied.

The sixth transistor T6 may be coupled between the first pixel power source ELVDD and the first node N1. In other words, the sixth transistor T6 may be coupled between the first pixel power source ELVDD and the first electrode of the first transistor T1. In addition, a gate electrode of the sixth transistor T6 may be coupled to the i-th emission control line Ei. The sixth transistor T6 may be turned off when the emission control signal is supplied to the i-th emission control line Ei, and may be turned on when the emission control signal is not supplied.

The storage capacitor Cst may be coupled between the first pixel power source ELVDD and the second node N2. In other words, the storage capacitor Cst may be coupled between the first pixel power source ELVDD and the gate electrode of the first transistor T1. The storage capacitor Cst may store a voltage corresponding to the data signal and the threshold voltage of the first transistor T1.

According to some exemplary embodiments, the organic light emitting diode OLED may generate various colored lights including red, green, and blue corresponding to the amount of current supplied from the driving transistor, but exemplary embodiments are not limited thereto. For example, the organic light emitting diode OLED may generate white light corresponding to the amount of current supplied from the driving transistor. In this case, a color image can be implemented using a separate color filter, etc.

Figure 2B:
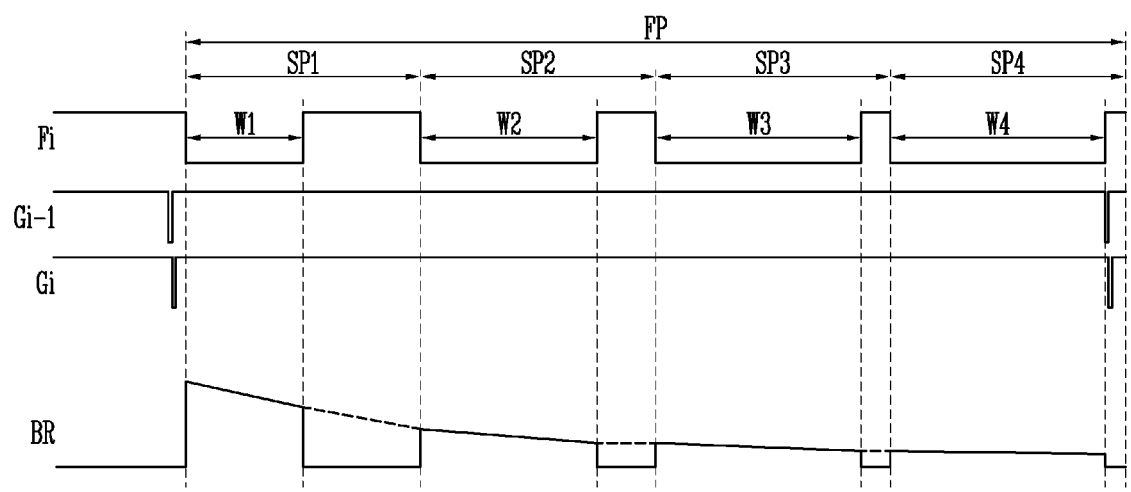
FIG. 2B is a waveform diagram illustrating an operation of the pixel of FIG. 2A according to some exemplary embodiments.

FIG. 2B is a waveform diagram illustrating an operation of the pixel of FIG. 2A according to some exemplary embodiments.

During one frame period FP, a scan signal Gi−1 is supplied to the (i−1)-th scan line Si−1, a scan signal Gi is supplied to the i-th scan line Si, and an emission control signal Fi is supplied to the i-th emission control line Ei.

Referring to FIG. 2B, the one frame period FP may include a plurality of sub-periods SP1, SP2, SP3, and SP4. For example, the one frame period FP may include a first sub-period SP1, a second sub-period SP2, a third sub-period SP3, and a fourth sub-period SP4. In this case, the emission control signal Fi for controlling an emission period of the pixel PX may be supplied in each of the sub-periods SP1, SP2, SP3, or SP4.

Figure 4A:
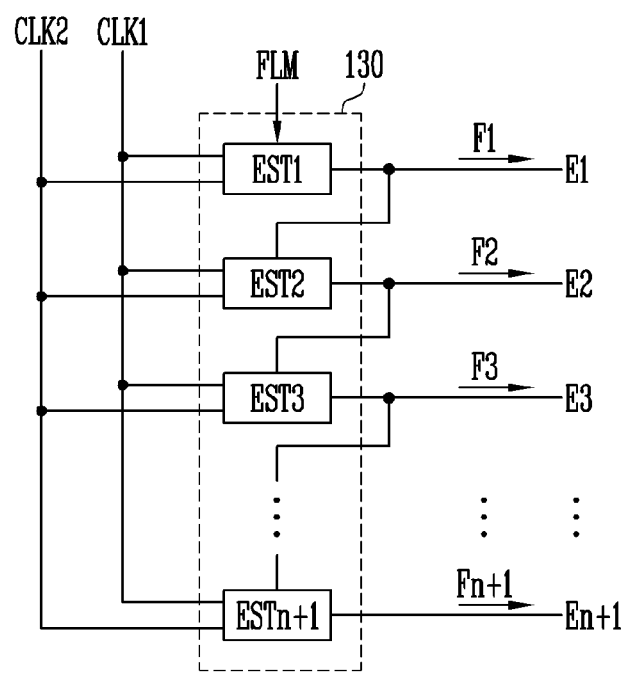
FIG. 4A is a block diagram illustrating an emission driver according to some exemplary embodiments.
Figure 4B:
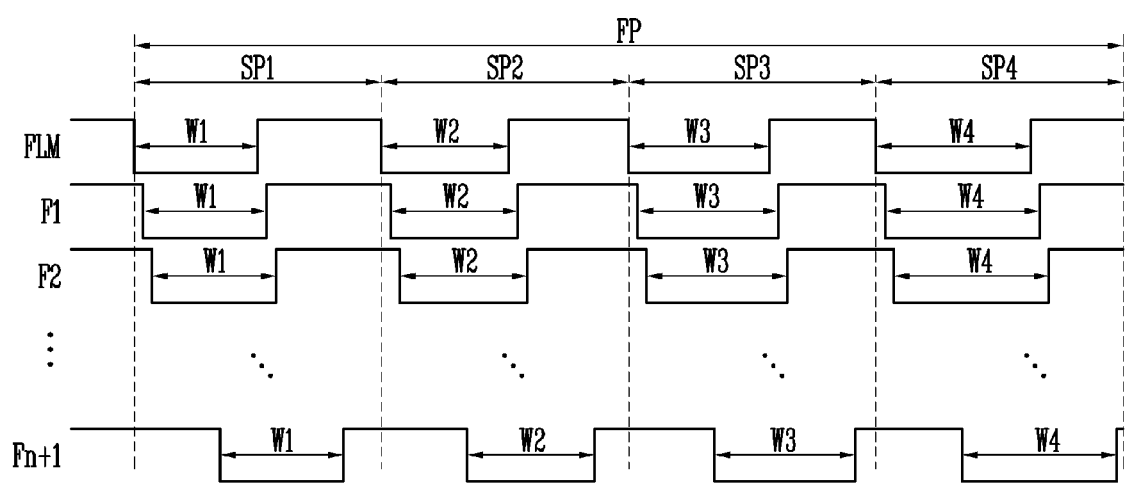
FIG. 4B is a waveform diagram illustrating an operation of the emission driver of FIG. 4A according to some exemplary embodiments.

The controller 140 may control the width (or duty ratio) of the emission start signal FLM (see FIGS. 4A and 4B). Accordingly, the controller 140 can control the entire supply period (duty ratio) of the emission control signals Fi during the one frame period FP. Consequently, the controller 140 can control the emission time and emission amount of the pixel PX. That is, when the controller 140 decreases the width of the emission start signal FLM, the accumulation amount (i.e., the emission amount) of instantaneous luminance BR of the pixel PX may be decreased. In addition, when the controller 140 increases the width of the emission start signal FLM, the accumulation amount of instantaneous luminance BR of the pixel PX may be increased.

In some exemplary embodiments, widths of the emission control signals Fi for the respective sub-periods SP1, SP2, SP3, and SP4 may be set different from one another. For instance, an i-th emission control signal Fi may have first to fourth signal widths W1 to W4. The i-th emission control signal Fi may have a first signal width W1 during the first sub-period SP1, have a second signal width W2 during the second sub-period SP2, have a third signal width W3 during the third sub-period SP3, and have a fourth signal width W4 during the fourth sub-period SP4.

According to some exemplary embodiments, as shown in FIG. 2B, the width of the i-th emission control signal Fi may increase as time elapses. For example, the fourth signal width W4 may be larger than the third signal width W3, the third signal width W3 may be larger than the second signal width W2, and the second signal width W2 may be larger than the first signal width W1.

An i-th scan signal Gi may be supplied for every frame period FP. In this case, the voltage of the data signal may be stored in the storage capacitor Cst for every frame period FP. For example, the instantaneous luminance BR of light generated from the organic light emitting diode OLED in the one frame period PF may be in proportion to the voltage stored in the storage capacitor Cst. It is noted that the voltage stored in the storage capacitor Cst in the one frame period FP may gradually decrease, and hence, the instantaneous luminance BR may gradually decrease, as shown in FIG. 2B.

Figure 3A:
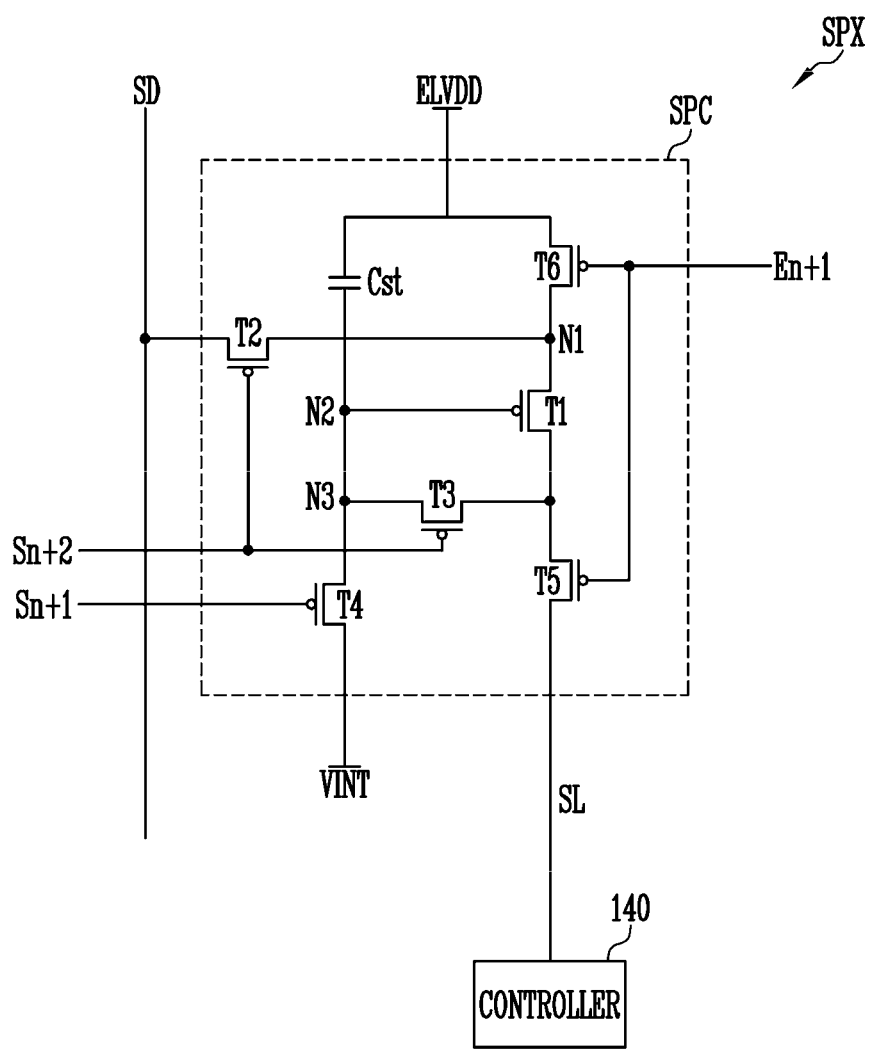
FIG. 3A is a circuit diagram illustrating an auxiliary pixel according to some exemplary embodiments.

FIG. 3A is a circuit diagram illustrating an auxiliary pixel according to some exemplary embodiments. The configuration of the auxiliary pixel circuit SPC is substantially identical to that of the pixel circuit PC shown in FIG. 2A, and therefore, contents overlapping with those of the pixel circuit PC shown in FIG. 2A will be omitted.

Referring to FIG. 3A, the auxiliary pixel SPX may include an auxiliary pixel circuit SPC, which may be coupled to the controller 140 through an auxiliary line SL. The controller 140 may measure an auxiliary current supplied from the auxiliary pixel SPX, i.e., the auxiliary pixel circuit SPC. The controller 140 may generate the emission driver control signal ECS supplied to the emission driver 130 based on an accumulation amount of the measured auxiliary current. For example, the controller 140 may control the width (or duty ratio) of the emission start signal FLM based on the accumulation amount of the measured auxiliary current.

The auxiliary pixel circuit SPC may control an amount of auxiliary current. To this end, the auxiliary pixel circuit SPC may include a first transistor T1, a second transistor T2, a third transistor T3, a fourth transistor T4, at least one emission transistor, and a storage capacitor Cst.

The second transistor T2 of the auxiliary pixel circuit SPC may be coupled between a first electrode of the first transistor T1 and an auxiliary data line SD. In addition, a gate electrode of the second transistor T2 may be coupled to an (n+2)-th scan line Sn+2. The second transistor T2 may be turned on when a scan signal is supplied to the (n+2)-th scan line Sn+2 to allow the auxiliary data line SD and a first node N1 to be electrically coupled to each other.

A gate electrode of the third transistor T3 of the auxiliary pixel circuit SPC may be coupled to the (n+2)-th scan line Sn+2. A gate electrode of the fourth transistor T4 of the auxiliary pixel circuit SPC may be coupled to an (n+1)-th scan line Sn+1. A gate electrode of the at least one emission transistor of the auxiliary pixel circuit SPC may be coupled to an (n+1)-th emission control line En+1.

The emission transistor may be located on a path of auxiliary current, and may allow the auxiliary current to flow corresponding to an emission control signal supplied from the (n+1)-th emission control line En+1. For example, the emission transistor may include the fifth transistor (i.e., a first emission control transistor) T5 and a sixth transistor (i.e., a second emission control transistor) T6.

The fifth transistor T5 may be coupled between a second electrode of the first transistor T1 and an auxiliary line SL. In addition, a gate electrode of the fifth transistor T5 may be coupled to the (n+1)-th emission control line En+1. The fifth transistor T5 may be turned off when the emission control signal is supplied to the (n+1)-th emission control line En+1, and may be turned on when the emission control signal is not supplied.

Figure 3B:
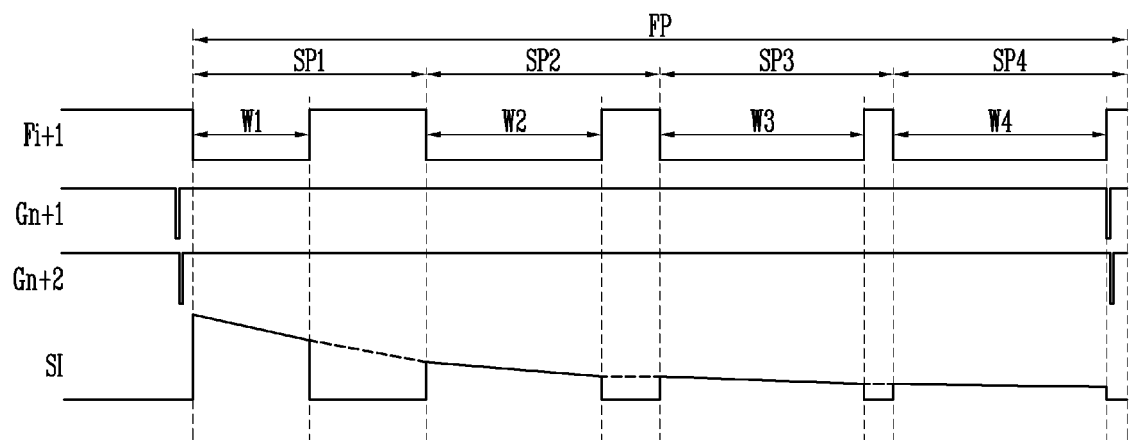
FIG. 3B is a waveform diagram illustrating an operation of the auxiliary pixel of FIG. 3A according to some exemplary embodiments.

FIG. 3B is a waveform diagram illustrating an operation of the auxiliary pixel of FIG. 3A according to some exemplary embodiments. The operation of the auxiliary pixel SPX shown in FIG. 3B is substantially identical to that of the pixel PX shown in FIG. 2B, and therefore, differences from the pixel PX shown in FIG. 2B will be mainly described.

During one frame period FP, an (n+1)-th scan signal Gn+1 is supplied to the (n+1)-th scan line Sn+1, an (n+2)-th scan signal Gn+2 is supplied to the (n+2)-th scan line Sn+2, and an (n+1)-th emission control signal Fn+1 is supplied to the (n+1)-th emission control line En+1.

Referring to FIG. 3B, the one frame period FP may include a plurality of sub-periods SP1, SP2, SP3, and SP4. The one frame period FP may include a first sub-period SP1, a second sub-period SP2, a third sub-period SP3, and a fourth sub-period SP4. In this case, the (n+1)-th emission control signal Fn+1 for controlling the flow of auxiliary current SI may be supplied in each of the sub-periods SP1, SP2, SP3, or SP4. The controller 140 may control the width (or duty ratio) of the emission start signal FLM (see FIGS. 4A and 4B). Accordingly, the controller 140 can control the entire supply period (duty ratio) of the (n+1)-th emission control signal Fn+1 during the one frame period FP. Consequently, the controller 140 can control the accumulation amount of the auxiliary current SI.

When the controller 140 decreases the width of each emission control signal Fn+1, the accumulation amount of the auxiliary current SI may decrease. When the controller 140 increases the width of each emission control signal Fn+1, the accumulation amount of the auxiliary current SI may increase. Widths of the (n+1)-th emission control signal Fn+1 for the respective sub-periods SP1, SP2, SP3, and SP4 may be set different from one another.

For example, the (n+1)-th emission control signal Fn+1 may have first to fourth signal widths W1 to W4. The (n+1)-th emission control signal Fn+1 may have a first signal width W1 during the first sub-period SP1, have a second signal width W2 during the second sub-period SP2, have a third signal width W3 during the third sub-period SP3, and have a fourth signal width W4 during the fourth sub-period SP4. In some exemplary embodiments, the width of the (n+1)-th emission control signal Fn+1 may increase as time elapses. For example, the fourth signal width W4 may be larger than the third signal width W3, the third signal width W3 may be larger than the second signal width W2, and the second signal width W2 may be larger than the first signal width W1.

The (n+2)-th scan signal Gn+2 may be supplied for every frame period FP. In this case, the voltage of an auxiliary data signal may be stored in the storage capacitor Cst for every frame period FP. For example, the auxiliary current SI in the one frame period PF may be in proportion to the voltage stored in the storage capacitor Cst. It is noted that the voltage stored in the storage capacitor Cst in the one frame period FP gradually decreases, and hence, the auxiliary current SI may gradually decrease, as shown in FIG. 3B.

FIG. 4A is a block diagram illustrating an emission driver according to some exemplary embodiments.

Referring to FIG. 4A, the emission driver 130 may include a plurality of emission stage circuits EST1 to ESTn+1. The emission stage circuits EST1 to ESTn+1 may be coupled to one (or first) ends of the emission control lines E1 to En+1, respectively. Accordingly, the emission stage circuits EST1 to ESTn+1 may supply emission control signals F1 to Fn+1 to the emission control lines E1 to En, respectively. In this case, the emission stage circuits EST1 to ESTn+1 may be operated corresponding to clock signals CLK1 and CLK2 supplied from the controller 140. Also, in some exemplary embodiments, the emission stage circuits EST1 to ESTn+1 may be implemented as the same circuit.

The emission start signal FLM may be included in the emission driver control signal ECS supplied from the controller 140. Each of the emission stage circuits EST1 to ESTn+1 may be supplied with an output signal (i.e., an emission control signal) of a previous emission stage circuit thereof or the emission start signal FLM. For instance, a first emission stage circuit EST1 may be supplied with the emission start signal FLM, and each of the other emission stage circuits EST2 to ESTn+1 may be supplied with an output signal of a previous emission stage circuit thereof.

According to some exemplary embodiments, the width of the emission control signals F1 to Fn+1 may be determined corresponding to the width of the emission start signal FLM. For instance, as the width of the emission start signal FLM is widened, the width of the emission control signals F1 to Fn+1 may be widened.

FIG. 4B is a waveform diagram illustrating an operation of the emission driver of FIG. 4A according to some exemplary embodiments. In particular, an operation of the emission driver 130 during one frame period FP is illustrated in FIG. 4B. The one frame period FP may include a plurality of sub-periods SP1, SP2, SP3, and SP4.

For example, the one frame period FP may include a first sub-period SP1, a second sub-period SP2, a third sub-period SP3, and a fourth sub-period SP4. The emission driver 130 may supply the emission control signals F1 to Fn+1 during each of the sub-periods SP1, SP2, SP3, and SP4, corresponding to the emission start signal FLM. The emission driver 130 may supply the emission control signals F1 to Fn+1 to the emission control lines E1 to En+1. In this case, each of the emission control signals F1 to Fn+1 may have first to fourth signal widths W1 to W4.

In some exemplary embodiments, the emission driver 130 may supply the emission control signals F1 to Fn+1 having a first signal width W1 during the first sub-period SP1, supply the emission control signals F1 to Fn+1 having a second signal width W2 during the second sub-period SP2, supply the emission control signals F1 to Fn+1 having a third signal width W3 during the second sub-period SP3, and supply the emission control signals F1 to Fn+1 having a fourth signal width W4 during the fourth sub-period SP4. The width of each of the emission control signals F1 to Fn+1 may increase as time elapses. For example, the fourth signal width W4 may be larger than the third signal width W3. The third signal width W3 may be larger than the second signal width W2. The second signal width W2 may be larger than the first signal width W1.

Figure 5:
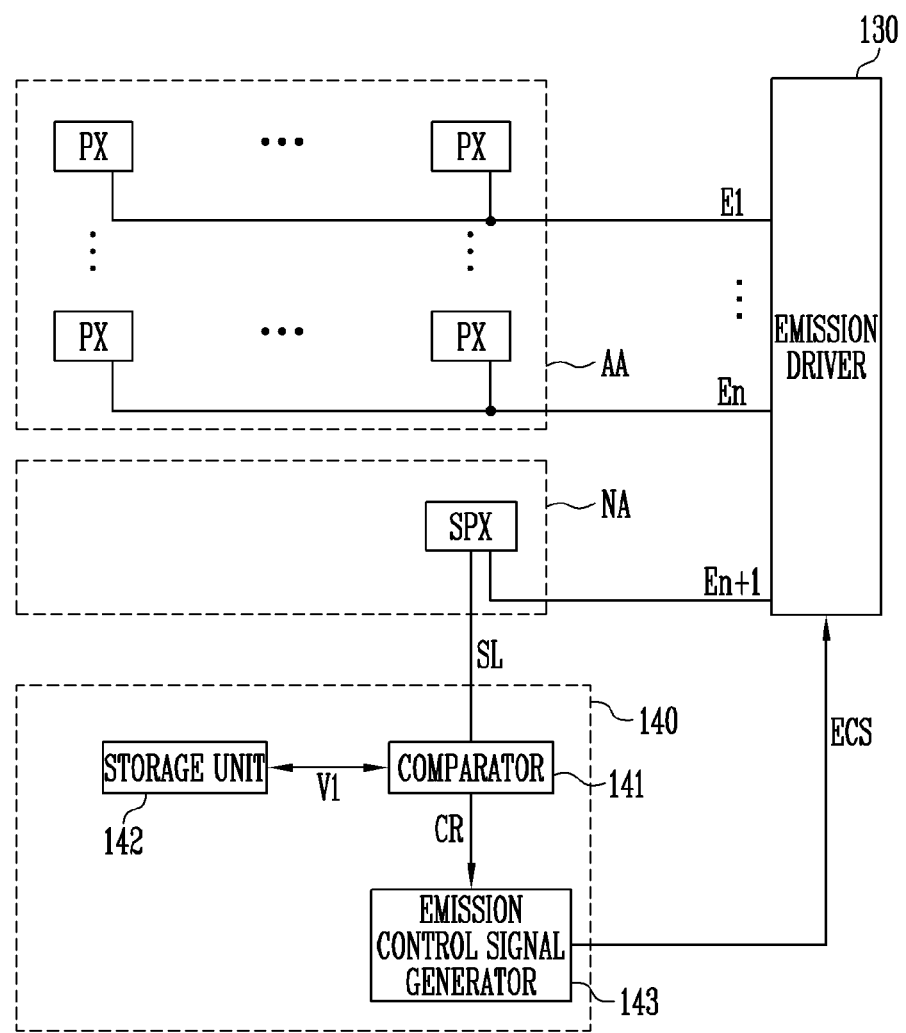
FIG. 5 is a block diagram illustrating a controller of a display device according to some exemplary embodiments.

FIG. 5 is a block diagram illustrating a controller of a display device according to some exemplary embodiments. For convenience of description, the pixels PX, the auxiliary pixel SPX, the emission driver 130, and the plurality of emission control lines E1 to En+1 are further illustrated in FIG. 5.

Referring to FIG. 5, the controller 140 may include a comparator 141, a storage unit 142, and an emission control signal generator 143.

The comparator 141 may measure an accumulation amount of the auxiliary current SI (see FIG. 4B) supplied from the auxiliary pixel SPX. For example, the comparator 141 may measure the accumulation amount of the auxiliary current SI by measuring a voltage of the auxiliary line SL. The comparator 141 may store, as a comparison value V1, the maximum value of the accumulation amount of the auxiliary current SI during a first sub-period among a plurality of sub-periods, and output a comparison result signal CR when the accumulation amount of the auxiliary current SI becomes equal to the comparison value V1 during the other sub-periods except the first sub-period. For example, the comparator 141 may measure an accumulation amount of the auxiliary current SI during each of the first to fourth sub-period SP1 to SP4.

The comparator 141 may generate a comparison value V1. The comparison value V1 may be the maximum value of the accumulation amount of the auxiliary current SI measured during the first sub-period SP1. The accumulation amount of the auxiliary current SI may gradually increase as the auxiliary current SI flows, and may be initialized when each of the first to fourth sub-periods SP1 to SP4 is terminated. The comparator 141 may store the comparison value V1 in the storage unit 142.

The comparator 141 may compare an accumulation amount of the auxiliary current SI during each of the second to fourth sub-periods SP2 to SP4 with the comparison value V. When the accumulation amount of the auxiliary current SI is equal to the comparison value V1, the comparator 141 may output a comparison result signal CR to the emission control signal generator 143. The emission control signal generator 143 may receive the comparison result signal CR from the comparator 141.

The emission control signal generator 143 may control the width (or duty ratio) of the emission start signal FLM based on the comparison result signal CR. The emission control signal generator 143 may output the emission start signal FLM to the emission driver 130. For example, the emission control signal generator 143 may generate the emission start signal FLM having a preset duty ratio during the first sub-period SP1. Therefore, the emission control signal generator 143 may generate the emission start signal FLM having a first signal width W1 during the first sub-period SP1.

The emission control signal generator 143 may toggle the emission start signal FLM when the comparison result signal CR is received from the comparator 141 during the second sub-period SP2. Therefore, the emission control signal generator 143 may generate the emission start signal FLM having a second signal width W2 during the second sub-period SP2.

The emission control signal generator 143 may toggle the emission start signal FLM when the comparison result signal CR is received from the comparator 141 during the third sub-period SP3. Therefore, the emission control signal generator 143 may generate the emission start signal FLM having a third signal width W3 during the third sub-period SP3.

The emission control signal generator 143 may toggle the emission start signal FLM when the comparison result signal CR is received from the comparator 141 during the fourth sub-period SP4. Therefore, the emission control signal generator 143 may generate the emission start signal FLM having a fourth signal width W4 during the fourth sub-period SP4.

The emission control signal generator 143 may output the emission driver control signal ECS including the emission start signal FLM to the emission driver 130. The emission driver 130 may supply a plurality of emission control signals F1 to Fn+1 to a plurality of emission control lines E1 to En+1 based on the emission driver control signal ECS.

Figure 6A:
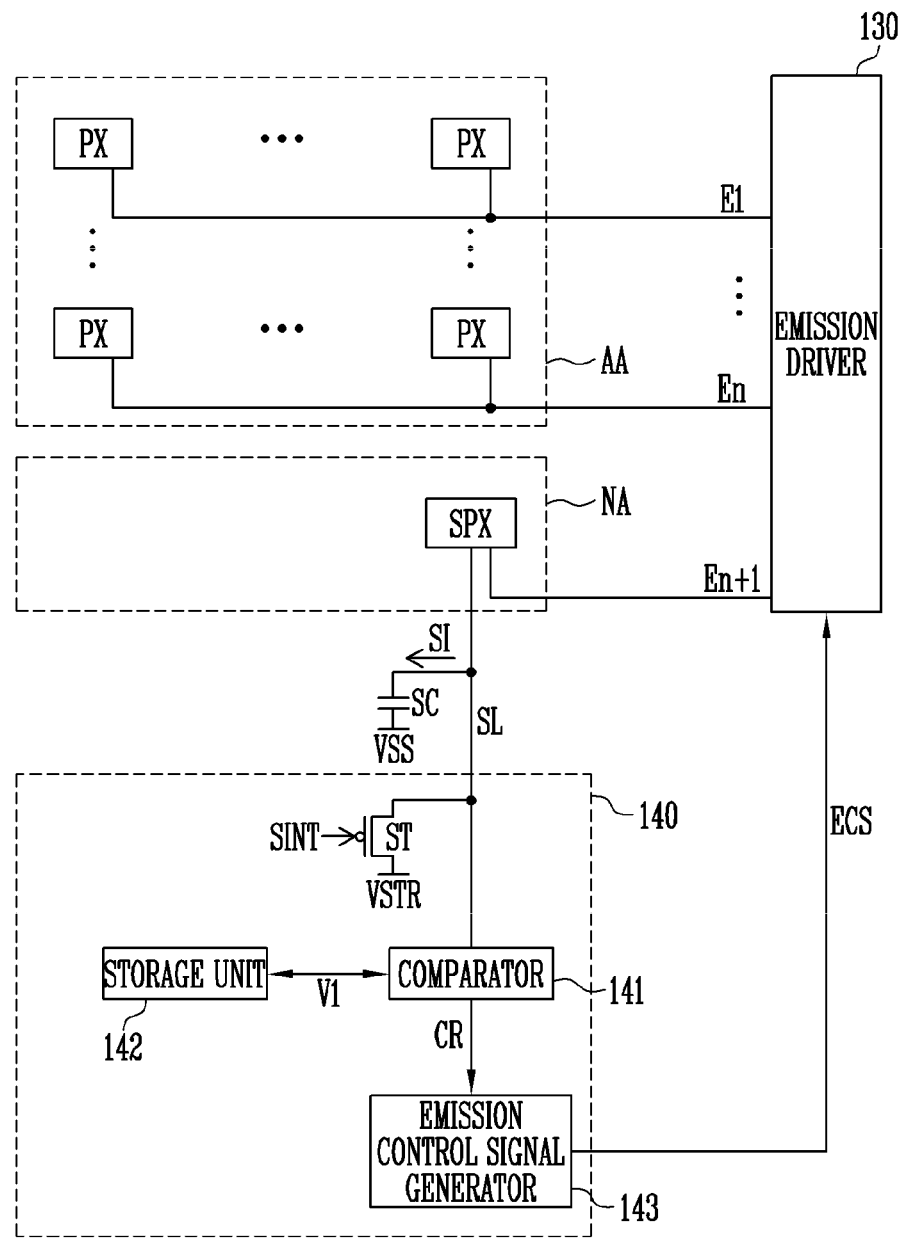
FIG. 6A is a diagram illustrating a display device according to some exemplary embodiments.
Figure 6B:
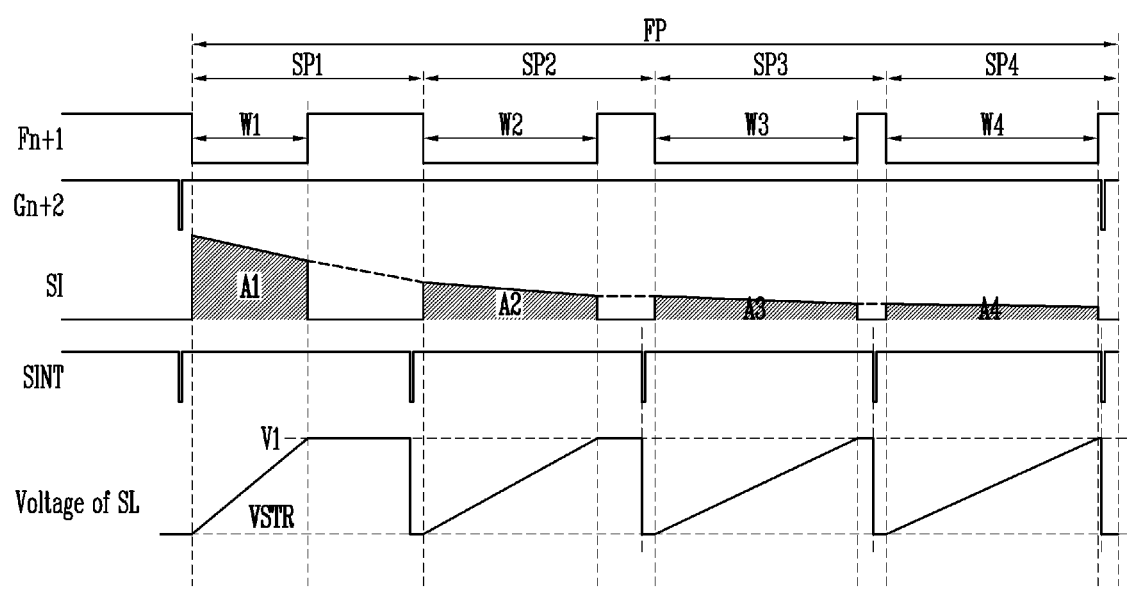
FIG. 6B is a waveform diagram illustrating an operation of the display device of FIG. 6A according to some exemplary embodiments.

FIG. 6A is a diagram illustrating a display device according to some exemplary embodiments. FIG. 6B is a waveform diagram illustrating an operation of the display device of FIG. 6A according to some exemplary embodiments. For convenience of description, contents overlapping with those of FIG. 5 will be omitted.

Referring to FIG. 6A, the display device 10 may further include an auxiliary capacitor SC coupled between the auxiliary line SL and an auxiliary power source VSS. In FIG. 6A, it is illustrated that the auxiliary capacitor SC is disposed at the outside of the display unit 100 and the controller 140, but exemplary embodiments are not limited thereto. For instance, the auxiliary capacitor SC may be disposed in the display unit 100 or the controller 140.

The auxiliary current SI supplied from the auxiliary pixel SPX may flow from the first pixel power source ELVDD to the auxiliary power source VSS through the auxiliary capacitor SC. For example, the voltage of the auxiliary power source VSS may be lower than that of the first pixel power source ELVDD, and may be equal to that of the second pixel power source ELVSS. As the auxiliary current SI flows through the auxiliary capacitor SC, electric charges may be accumulated in the auxiliary capacitor SC, and the voltage of the auxiliary line SL may increase. For example, the voltage of the auxiliary line SL may correspond to an accumulation amount of the auxiliary current SI.

The comparator 141 may measure a voltage of the auxiliary line SL. The comparator 141 may generate a comparison value V1. The comparison value V1 may be the maximum value of the voltage of the auxiliary line SL that is measured during the first sub-period SP1.

The controller 140 may further include an auxiliary transistor ST coupled between the auxiliary line SL and a start power source VSTR. The auxiliary transistor ST may be turned on for each of the sub-periods SP1 to SP4. For example, a gate electrode of the auxiliary transistor ST may receive a start signal SINT. In this case, the start signal SINT may have a voltage level at which the auxiliary transistor ST can be turned on. That is, the start signal SINT may have the gate-on voltage. Before each of the sub-periods SP1 to SP4 is terminated, the auxiliary transistor ST may be turned on according to the start signal SINT. Therefore, the auxiliary line SL may be initialized to the voltage of the start power source VSTR.

The comparator 141 may store the comparison value V1 in the storage unit 142. The comparator 141 may compare a voltage of the auxiliary line SL that is measured during each of the second to fourth sub-periods SP2 to SP4 with the comparison value V1. When the voltage of the auxiliary line SL, that is measured during the second sub-period SP2, is equal to the comparison value V1, the comparator 141 may output a comparison result signal CR to the emission control signal generator 143. When the voltage of the auxiliary line SL, that is measured during the third sub-period SP3, is equal to the comparison value V1, the comparator 141 may output a comparison result signal CR to the emission control signal generator 143. When the voltage of the auxiliary line SL, that is measured during the fourth sub-period SP4, is equal to the comparison value V1, the comparator 141 may output a comparison result signal CR the emission control signal generator 143.

The emission control signal generator 143 may control the width (or duty ratio) of the emission start signal FLM based on the comparison result signal CR. The emission control signal generator 143 may output the emission start signal FLM to the emission driver 130.

Referring to FIG. 6B, the accumulation amount of the auxiliary current SI flowing during the first sub-period SP1 may correspond to a first area A1, the accumulation amount of the auxiliary current SI flowing during the second sub-period SP2 may correspond to a second area A2, the accumulation amount of the auxiliary current SI flowing during the third sub-period SP3 may correspond to a third area A3, and the accumulation amount of the auxiliary current SI flowing during the fourth sub-period SP4 may correspond to a fourth area A4. According to some exemplary embodiments, the first area A1, the second area A2, the third area A3, and the fourth area A4 may be equal to one another.

In the above-described manner, the emission control signal generator 143 generates the emission start signal FLM so that it is possible to prevent (or reduce) a flicker phenomenon that occurs when the display device is driven in a low frequency mode. As described above, the display device 10_1 shown in FIG. 1B also operates in the manner described in FIGS. 2A to 6B, thereby obtaining an effect substantially identical to that described in association with the display device 10 of FIG. 1A.

Figure 7:
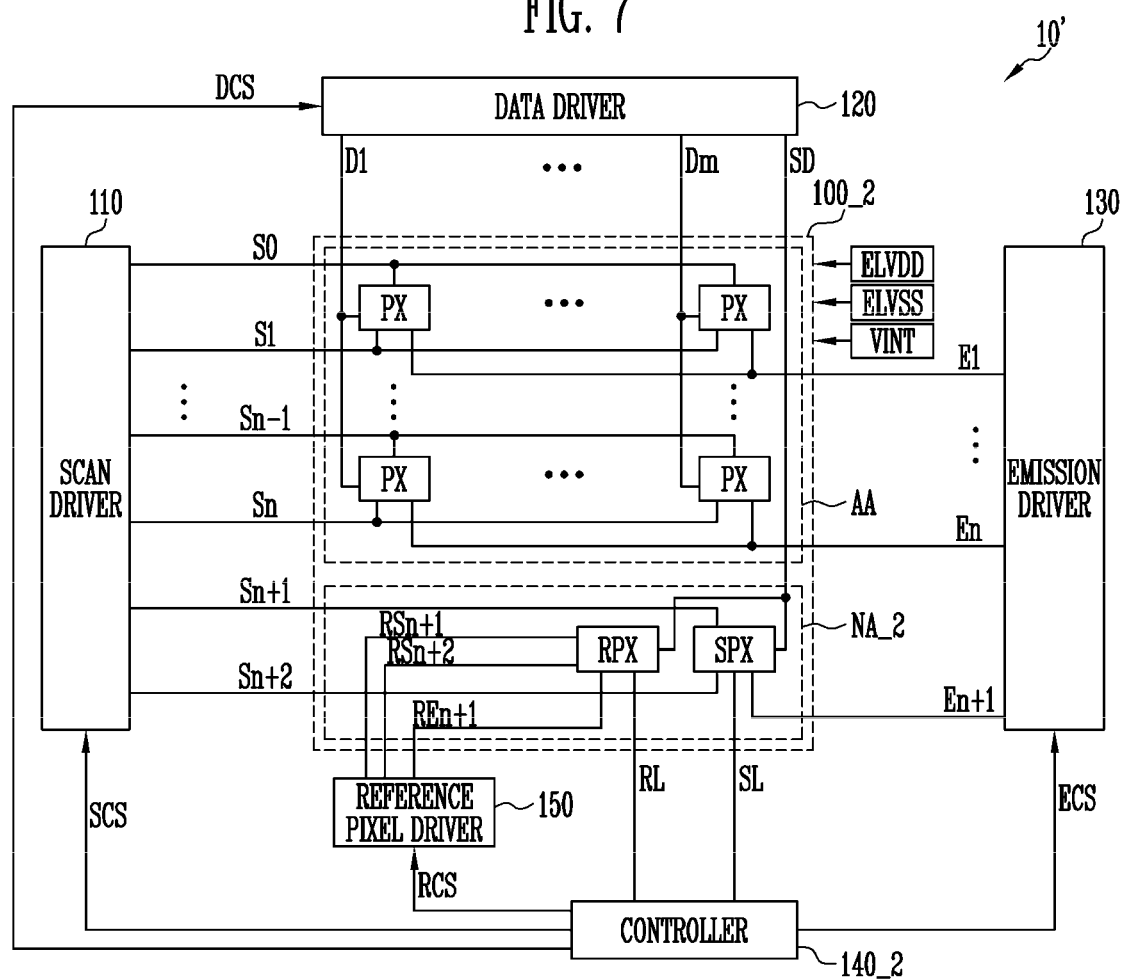
FIG. 7 is a block diagram illustrating a display device according to some exemplary embodiments.

FIG. 7 is a block diagram illustrating a display device according to some exemplary embodiments. For convenience of description, contents overlapping with those of FIGS. 1A and 1B will be omitted.

Referring to FIGS. 1A, 1B, and 7, the display device 10' may include a display unit 100_2, a scan driver 110, a data driver 120, an emission driver 130, a controller 140_2, and a reference pixel driver 150. Although FIG. 7 illustrates a display region AA located above a non-display region NA_2, exemplary embodiments are not limited thereto. For instance, as shown in FIG. 1B, in some exemplary embodiments, the non-display region NA_2 may be set at various positions, e.g., above the display region AA.

The display unit 100_2 may include pixels PX, at least one auxiliary pixel SPX, and at least one reference pixel RPX. The reference pixel RPX may be disposed on (or in) the non-display region NA_2. For example, the reference pixel RPX may be located at a position at which an auxiliary data line SD, reference scan lines RSn+1 and RSn+2, and a reference emission control line REn+1 intersect one another.

The reference pixel RPX may be coupled to the auxiliary data line SD, the reference scan lines RSn+1 and RSn+2, and the reference emission control line REn+1. In this manner, the reference pixel RPX may be supplied with an auxiliary data signal, reference scan signals, and a reference emission control signal through the auxiliary data line SD, the reference scan lines RSn+1 and RSn+2, and the reference emission control line REn+1. The reference pixel RPX may be supplied with reference scan signals from the reference scan lines RSn+1 and RSn+2, and may be supplied with an auxiliary data signal synchronized with the reference scan signals from the auxiliary data line SD.

The reference pixel RPX may supply a reference current based on the auxiliary data signal. That is, the reference pixel RPX may control an amount of the reference current. In addition, the reference pixel RPX may be coupled to a plurality of reference scan lines. In some exemplary embodiments, the reference pixel RPX may be coupled to a "current" reference scan line and a "previous" reference scan line. For example, the reference pixel RPX may be coupled to an (n+1)-th reference scan line RSn+1 and an (n+2)-th reference scan line RSn+2.

The auxiliary data signal supplied to the auxiliary data line SD may be supplied to the auxiliary pixel SPX and the reference pixel RPX. To this end, the data driver 120 may supply an auxiliary data signal to the auxiliary data line SD in synchronization with scan signals and reference scan signals. The data driver 120 may supply an auxiliary data signal to the auxiliary data line SD corresponding to a data driver control signal DCS. The auxiliary data signal supplied to the auxiliary data line SD may be supplied to the auxiliary pixel SPX and the reference pixel RPX.

The reference pixel driver 150 may supply reference scan signals to the reference scan lines RSn+1 and RSn+2 corresponding to a reference pixel driver control signal RCS supplied from the controller 140_2. The reference pixel driver 150 may supply reference scan signals to the reference scan lines RSn+1 and RSn+2 for each of a plurality of sub-periods SP1 to SP4 (see FIG. 8B).

In some exemplary embodiments, the reference pixel driver 150 may allow the reference pixel RPX to be driven in a high frequency mode. For example, the reference pixel driver 150 may allow the reference pixel RPX to be driven at 60 Hz or 120 Hz. For example, the reference pixel driver 150 may sequentially supply reference scan signals to the reference scan lines RSn+1 and RSn+2.

According to some exemplary embodiments, the reference pixel driver 150 may supply reference scan signals in synchronization with scan signals supplied to scan lines Sn+1 and Sn+2. In this case, the reference scan signal may have a voltage level at which a transistor supplied with the reference scan signal can be turned on. That is, the reference scan signal may have the gate-on voltage.

The reference pixel driver 150 may supply a reference emission control signal to the reference emission control line REn+1 corresponding to the reference pixel driver control signal RCS. In this case, the reference emission control signal may have a voltage level at which a transistor supplied with the reference emission control signal can be turned on. That is, the reference emission control signal may have the gate-on voltage.

The controller 140_2 may further generate the reference pixel driver control signal RCS corresponding to the control signals supplied from the outside. In this case, the reference pixel driver control signal RCS may be provided to the reference pixel driver 150. The reference pixel driver control signal RCS may include a reference scan start signal, a reference emission start signal, and clock signals. The reference scan start signal may control supply timings of reference scan signals, and the reference emission start signal may control supply timings of reference emission control signals. The clock signals may be used to shift the reference emission start signal and the reference emission control signals.

The controller 140_2 may be coupled to the auxiliary pixel SPX through an auxiliary line SL. The controller 140_2 may measure an auxiliary current supplied from the auxiliary pixel SPX. In some exemplary embodiments, the operation in which the controller 140_2 measures the auxiliary current may include an operation in which the controller 140_2 senses a voltage formed by flow the auxiliary current.

In addition, the controller 140_2 may be coupled to the reference pixel RPX through a reference line RL. The controller 140_2 may measure a reference current supplied from the reference pixel RPX. In some exemplary embodiments, the operation in which the controller 140_2 measures the reference current may include an operation in which the controller 140_2 senses a voltage formed by flow of the reference current.

The controller 140_2 may control the width (or duty ratio) of an emission start signal FLM supplied to the emission driver 130 based on an accumulation amount of the auxiliary current and an accumulation amount of the reference current.

Although FIG. 7 illustrates n+3 scan lines S0 to Sn+2 and n+1 emission control lines E1 to En+1 being provided, exemplary embodiments are not limited thereto. In some exemplary embodiments, dummy scan lines and/or dummy emission control lines may be additionally formed so as to achieve more stable driving.

Also, although FIG. 7 illustrates one auxiliary pixel SPX, one auxiliary data line SD, and scan lines Sn+1 and Sn+2 coupled to the one auxiliary pixel SPX being provided, exemplary embodiments are not limited thereto. The display device 10' may further include a plurality of auxiliary pixels arranged in the non-display region NA_2, a plurality of auxiliary data lines that supply an auxiliary data signal to each of the plurality of auxiliary pixels, and a plurality of scan lines coupled to only the plurality of auxiliary pixels.

Further, although FIG. 7 illustrates one reference pixel RPX, one auxiliary data line SD, and reference scan lines RSn+1 and RSn+2 coupled to the one reference pixel RPX being provided, exemplary embodiments are not limited thereto. The display device 10' may further include a plurality of reference pixels arranged on the non-display region NA_2, a plurality of auxiliary data lines that supply an auxiliary data signal to each of the plurality of reference pixels, and a plurality of reference scan lines coupled to only the plurality of reference pixels.

Although FIG. 7 illustrates the scan driver 110, the data driver 120, the emission driver 130, the controller 140_2, and the reference pixel driver 150 being individually provided, exemplary embodiments are not limited thereto. For instance, at least some of these components may be integrated. To this end, the scan driver 110, the data driver 120, the emission driver 130, the controller 140_2, and the reference pixel driver 150 may be installed in various ways including chip-on-glass, chip-on-plastic, tape carrier package, chip-on-film, and the like.

Figure 8A:
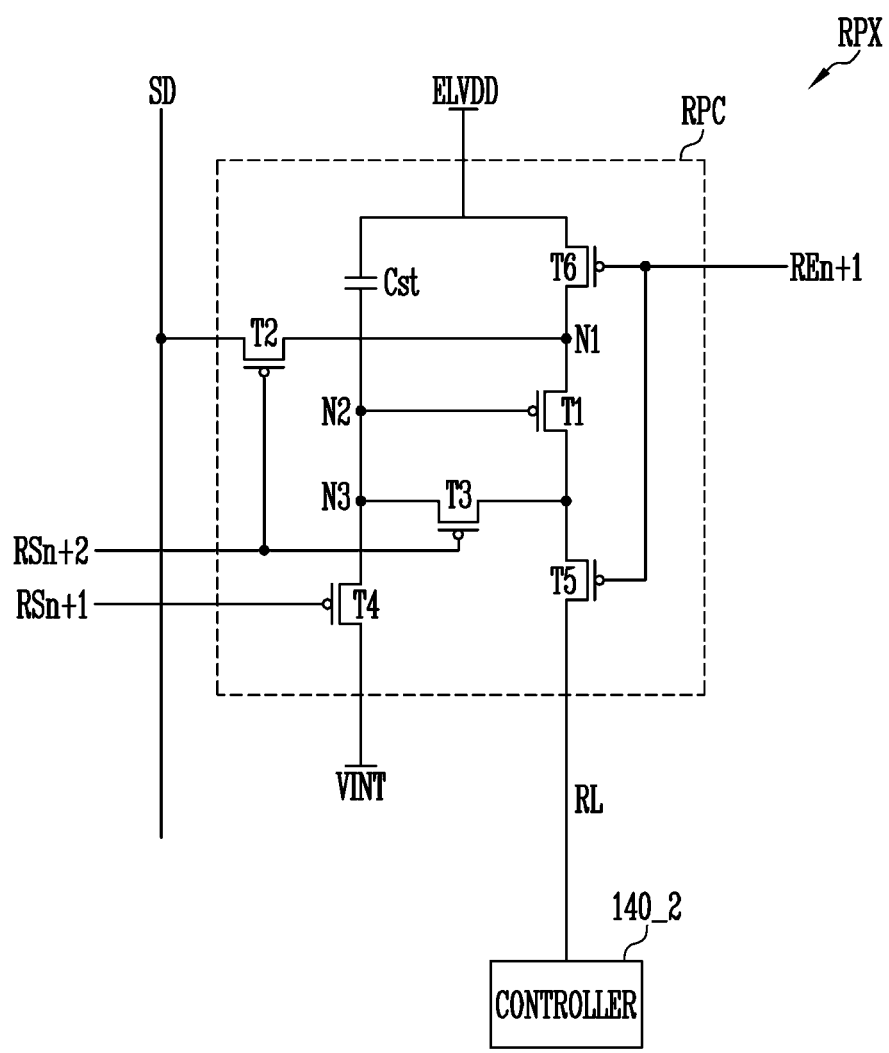
FIG. 8A is a circuit diagram illustrating a reference pixel according to some exemplary embodiments.

FIG. 8A is a circuit diagram illustrating a reference pixel according to some exemplary embodiments.

Referring FIG. 8A, the reference pixel RPX may include a reference pixel circuit RPC coupled to the controller 140_2 through a reference line RL. The configuration of the reference pixel circuit RPC is substantially identical to that of the auxiliary pixel circuit SPC shown in FIG. 3A, and therefore, contents overlapping with those of the auxiliary pixel circuit SPC shown in FIG. 3A will be omitted.

The controller 140_2 may measure a reference current supplied from the reference pixel RPX, i.e., the reference pixel circuit RPC. The controller 140_2 may generate the emission driver control signal ESC supplied to the emission driver 130 based on an accumulation amount of auxiliary current and an accumulation amount of reference current. For example, the controller 140_2 may control the width (or duty ratio) of the emission start signal FLM based on the accumulation amount of the auxiliary current and the accumulation amount of the reference current.

The reference pixel circuit RPC may control an amount of reference current. To this end, the reference pixel circuit RPC may include a first transistor T1, a second transistor T2, a third transistor T3, a fourth transistor T4, at least one emission transistor, and a storage capacitor Cst.

The second transistor T2 of the reference pixel circuit RPC may be coupled between a first electrode of the first transistor T1 and an auxiliary data line SD. In addition, a gate electrode of the second transistor T2 may be coupled to an (n+2)-th reference scan line RSn+2. The second transistor T2 may be turned on when a reference scan signal is supplied to the (n+2)-th reference scan line RSn+2 to allow the auxiliary data line SD and a first node N1 to be electrically coupled to each other.

A gate electrode of the third transistor T3 of the reference pixel circuit RPC may be coupled to the (n+2)-th reference scan line RSn+2. A gate electrode of the fourth transistor T4 of the reference pixel circuit RPC may be coupled to an (n+1)-th reference scan line RSn+1. A gate electrode of the at least one emission transistor of the reference pixel circuit RPC may be coupled to an (n+1)-th reference emission control line REn+1.

The emission transistor may be located on a path of reference current, and may allow the reference current to flow corresponding to a reference emission control signal supplied from the (n+1)-th reference emission control line REn+1. For example, the emission transistor may include the fifth transistor (i.e., a first emission control transistor) T5 and a sixth transistor (i.e., a second emission control transistor) T6.

The fifth transistor T5 may be coupled between a second electrode of the first transistor T1 and a reference line RL. In addition, a gate electrode of the fifth transistor T5 may be coupled to the (n+1)-th reference emission control line REn+1. The fifth transistor T5 may be turned off when the reference emission control signal is supplied to the (n+1)-th reference emission control line REn+1, and may be turned on when the emission control signal is not supplied.

Figure 8B:
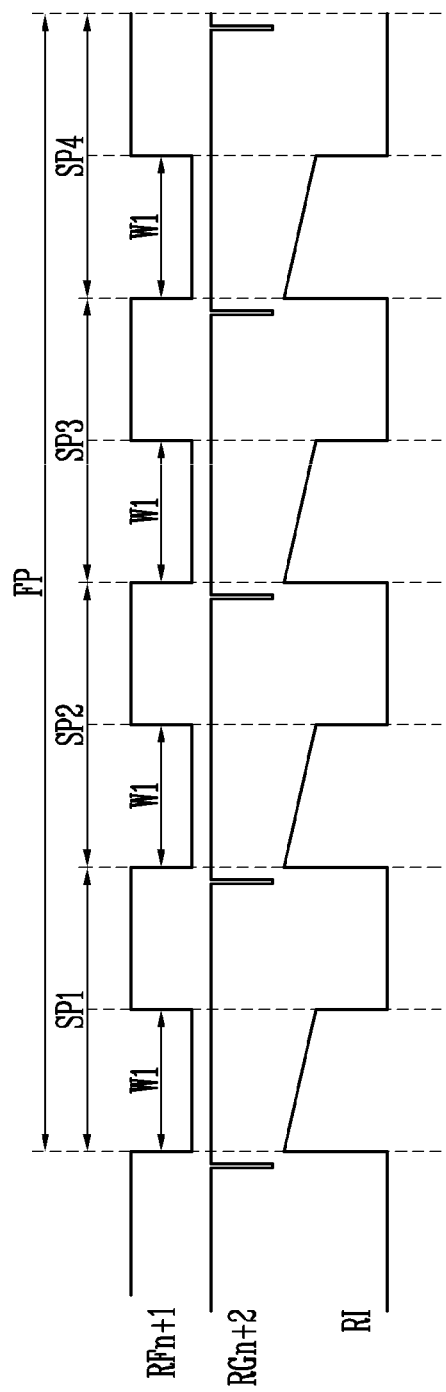
FIG. 8B is a waveform diagram illustrating an operation of the reference pixel of FIG. 8A according to some exemplary embodiments.

FIG. 8B is a waveform diagram illustrating an operation of the reference pixel of FIG. 8A according to some exemplary embodiments. The operation of the reference pixel RPX shown in FIG. 8B is similar to that of the auxiliary pixel circuit SPC shown in FIG. 3B, and therefore, differences from the auxiliary pixel circuit SPC shown in FIG. 3B will be mainly described.

According to some exemplary embodiments, during one frame period FP, an (n+1)-th reference scan signal RGn+1 is supplied to the (n+1)-th reference scan line RSn+1, an (n+2)-th reference scan signal RGn+2 is supplied to the (n+2)-th reference scan line RSn+2, and an (n+1)-th reference emission control signal RFn+1 is supplied to the (n+1)-th reference emission control line REn+1.

Referring to FIG. 8B, the one frame period FP may include a plurality of sub-periods SP1, SP2, SP3, and SP4. For instance, the one frame period FP may include a first sub-period SP1, a second sub-period SP2, a third sub-period SP3, and a fourth sub-period SP4. In this case, the (n+1)-th reference emission control signal RFn+1 for controlling the flow of reference current RI may be supplied in each of the sub-periods SP1, SP2, SP3, or SP4.

Widths of the (n+1)-th reference emission control signal RFn+1 for the respective sub-periods SP1, SP2, SP3, and SP4 may be set equal to one another. For example, the (n+1)-th reference emission control signal RFn+1 may have a first signal width W1. That is, the (n+1)-th reference emission control signal RFn+1 may have the first signal width W1 during the first to fourth sub-periods SP1 to SP4. The (n+2)-th reference scan signal RGn+2 may be supplied for each of the sub-periods SP1, SP2, SP3, and SP4. Therefore, initial values of the reference current RI for the respective sub-periods SP1, SP2, SP3, and SP4 may be equal to one another.

Figure 9:
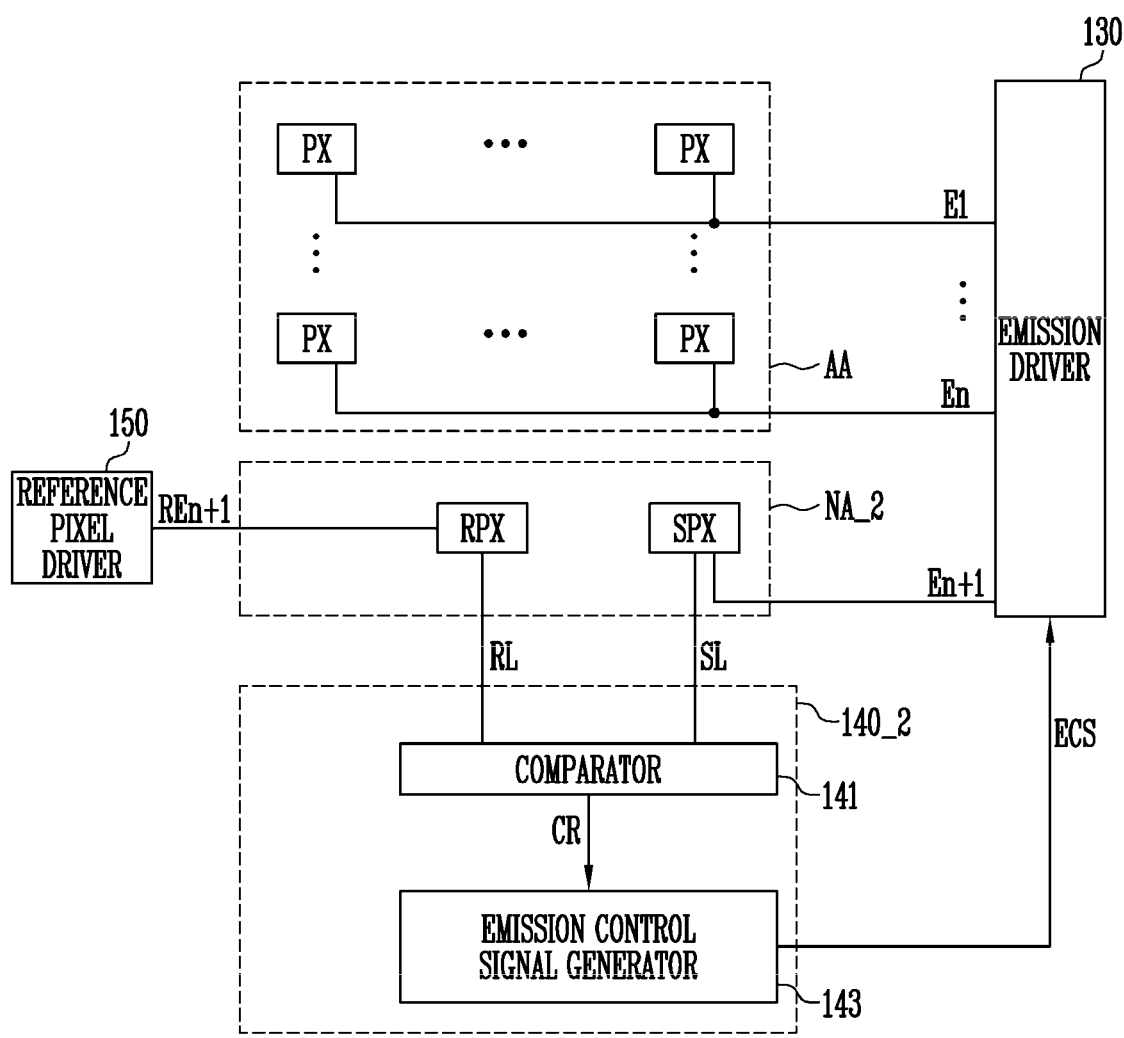
FIG. 9 is a block diagram illustrating a controller of a display device according to some exemplary embodiments.

FIG. 9 is a block diagram illustrating a controller of a display device according to some exemplary embodiments. For descriptive convenience, the pixels PX, the auxiliary pixel SPX, the reference pixel RPX, the emission driver 130, the reference pixel driver 150, and the plurality of emission control lines E1 to En+1 are also illustrated in FIG. 9.

Referring to FIG. 9, the controller 140_2 may include a comparator 141 and an emission control signal generator 143.

The comparator 141 may measure an accumulation amount of auxiliary current SI supplied from the auxiliary pixel SPX. For example, the comparator 141 may measure the accumulation amount of the auxiliary current SI by measuring a voltage of the auxiliary line SL. Also, the comparator 141 may measure an accumulation amount of reference current RI supplied from the reference pixel RPX. For example, the comparator 141 may measure an accumulation amount of the reference current RI by measuring a voltage of the reference line RL.

The comparator 141 may measure an accumulation amount of the auxiliary current SI and an accumulation amount of the reference current RI for each of the first to fourth sub-periods SP1 to SP4, and may compare the measured accumulation amounts with each other. The accumulation amount of the auxiliary current SI and the accumulation amount of the reference current RI may gradually increase as the current flows, and may be initialized when each of the first to fourth sub-periods SP1 to SP4 is terminated. If the accumulation amount of the auxiliary current SI and the accumulation amount of the reference current RI become equal to each other during each of the first to fourth sub-periods SP1 to SP4, the comparator 141 may output a comparison result signal CR to the emission control signal generator 143.

The emission control signal generator 143 may receive the comparison result signal CR from the comparator 141. The emission control signal generator 143 may control the width (or duty ratio) of the emission start signal FLM based on the comparison result signal CR. The emission control signal generator 143 may output the emission start signal FLM to the emission driver 130. For example, the emission control signal generator 143 may generate the emission start signal FLM having a preset duty ratio during the first sub-period SP1. Therefore, the emission control signal generator 143 may generate the emission start signal FLM having a first signal width W1 during the first sub-period SP1.

The emission control signal generator 143 may toggle the emission start signal FLM when the comparison result signal CR is received from the comparator 141 during the second sub-period SP2. Therefore, the emission control signal generator 143 may generate the emission start signal FLM having a second signal width W2 during the second sub-period SP2.

The emission control signal generator 143 may toggle the emission start signal FLM when the comparison result signal CR is received from the comparator 141 during the third sub-period SP3. Therefore, the emission control signal generator 143 may generate the emission start signal FLM having a third signal width W3 during the third sub-period SP3.

The emission control signal generator 143 may toggle the emission start signal FLM when the comparison result signal CR is received from the comparator 141 during the fourth sub-period SP4. Therefore, the emission control signal generator 143 may generate the emission start signal FLM having a fourth signal width W4 during the fourth sub-period SP4.

The emission control signal generator 143 may output the emission driver control signal ECS including the emission start signal FLM to the emission driver 130. The emission driver 130 may supply a plurality of emission control signals F1 to Fn+1 to a plurality of emission control lines E1 to En+1 based on the emission driver control signal ECS.

Figure 10A:
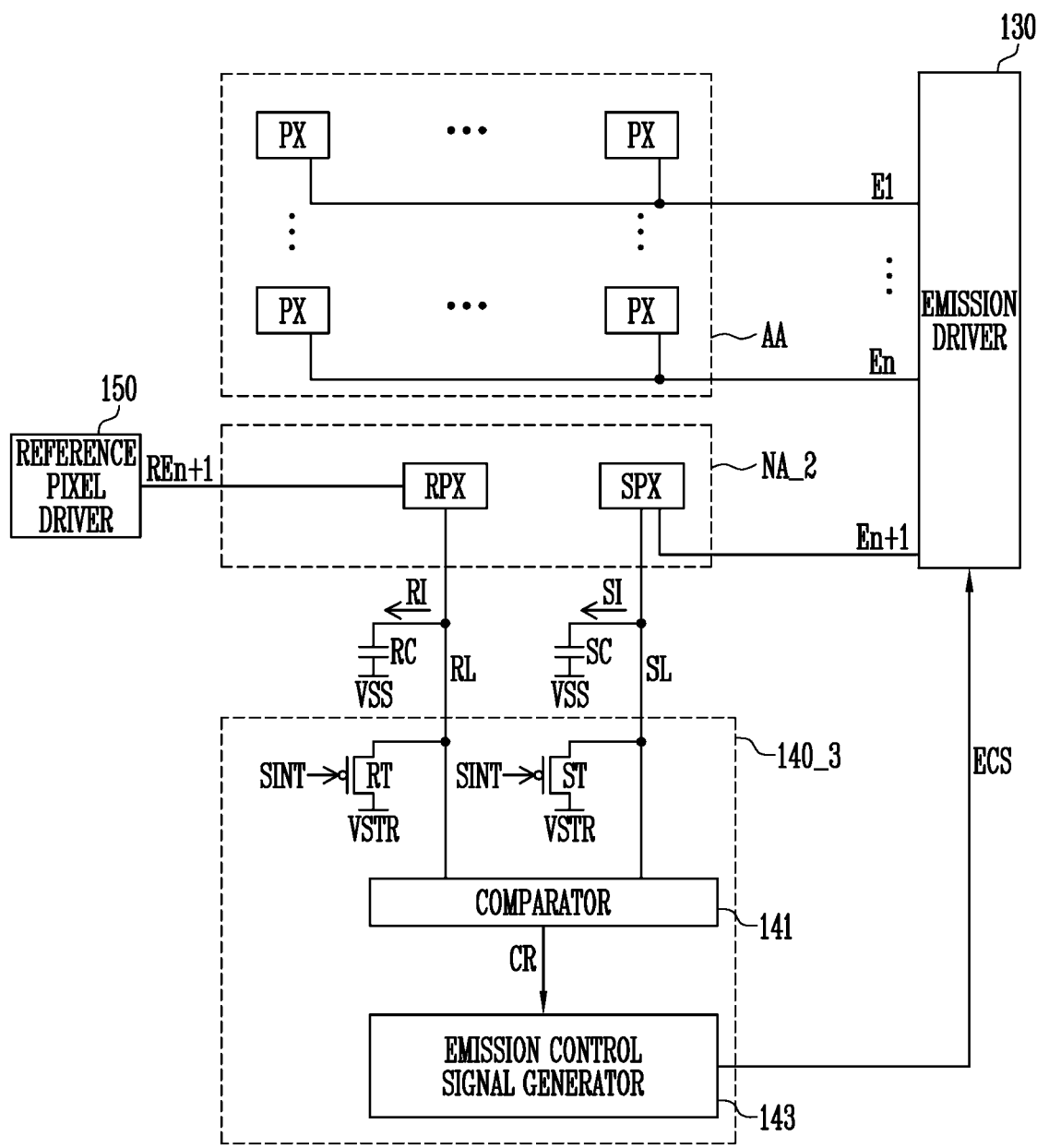
FIG. 10A is a diagram illustrating a display device according to some exemplary embodiments.

FIG. 10A is a diagram illustrating a display device according to some exemplary embodiments. FIG. 10B is a waveform diagram illustrating an operation of the display device of FIG. 10A according to some exemplary embodiments. For convenience of description, contents overlapping with those of FIG. 9 will be omitted.

Referring to FIG. 10A, the display device 10' may further include an auxiliary capacitor SC coupled between the auxiliary line SL and an auxiliary power source VSS. In some exemplary embodiments, the auxiliary capacitor SC may be disposed in the display unit 100_2 or the controller 140_3, but exemplary embodiments are not limited thereto. Also, the display device 10' may further include a reference capacitor RC coupled between the reference line RL and an auxiliary power source VSS. In some exemplary embodiments, the reference capacitor RC may be disposed in the display unit 100_2 or the controller 140_3, but exemplary embodiments are not limited thereto.

The auxiliary current SI supplied from the auxiliary pixel SPX may flow from the first pixel power source ELVDD to the auxiliary power source VSS through the auxiliary capacitor SC. For example, the voltage of the auxiliary power source VSS may be lower than that of the first pixel power source ELVDD, and may be equal to that of the second pixel power source ELVSS. As the auxiliary current SI flows through the auxiliary capacitor SC, electric charges may be accumulated in the auxiliary capacitor SC, and the voltage of the auxiliary line SL may increase.

As the reference current RI flows through the auxiliary capacitor SC, electric charges may be accumulated in the auxiliary capacitor SC, and the voltage of the reference line RL may increase. For example, the voltage of the auxiliary line SL may correspond to an accumulation amount of the auxiliary current SI, and the voltage of the reference line RL may correspond to an accumulation amount of the reference current RI.

The comparator 141 may measure a voltage of the auxiliary line SL and a voltage of the reference line RL. The comparator 141 may compare a voltage of the auxiliary line SL and a voltage of the reference line RL that are measured during each of the first to fourth sub-periods SP1 to SP4.

The controller 140 may further include an auxiliary transistor ST coupled between the auxiliary line SL and a start power source VSTR and a reference transistor RT coupled between the reference line RL and the start power source VSTR. The auxiliary transistor ST and the reference transistor RT may be turned on for each of the sub-periods SP1 to SP4. For example, a gate electrode of the sub-transistor ST and a gate electrode of the reference transistor RT may receive a start signal SINT. In this case, the start signal SINT may have a voltage level at which the sub-transistor ST and the reference transistor RT can be turned on. That is, the start signal SINT may have the gate-on voltage.

Before each of the sub-periods SP1 to SP4 is terminated, the auxiliary transistor ST and the reference transistor RT may be turned on according to the start signal SINT. Therefore, the auxiliary line SL and the reference line RL may be initialized to the voltage of the start power source VSTR. When the voltage of the auxiliary line SL and the voltage of the reference line RL become equal to each other during each of the sub-periods SP1 to SP4, the comparator 141 may output a comparison result signal CR to the emission control signal generator 143.

The emission control signal generator 143 may control the width (or duty ratio) of the emission start signal FLM based on the comparison result signal CR. The emission control signal generator 143 may output the emission start signal FLM to the emission driver 130. In some exemplary embodiments, the auxiliary transistor ST may be the same transistor as the reference transistor RT. In addition, the auxiliary capacitor SC may be the same capacitor as the reference capacitor RC.

Referring to FIG. 10B, the accumulation amount of the auxiliary current SI flowing during the first sub-period SP1 may correspond to a first area A1, the accumulation amount of the auxiliary current SI flowing during the second sub-period SP2 may correspond to a second area A2, the accumulation amount of the auxiliary current SI flowing during the third sub-period SP3 may correspond to a third area A3, and the accumulation amount of the auxiliary current SI flowing during the fourth sub-period SP4 may correspond to a fourth area A4. In this case, the first area A1, the second area A2, the third area A3, and the fourth area A4 may be equal to one another.

According to some exemplary embodiments, the accumulation amount of the reference current RI flowing during each of the sub-periods SP1 to SP4 may correspond to the first area A1. In the above-described manner, the emission control signal generator 143 generates the emission start signal FLM so that it is possible to prevent (or reduce) a flicker phenomenon that occurs when the display device is driven in a low frequency mode.

According to various exemplary embodiments, it is possible to prevent (or reduce) a flicker phenomenon when a display device is driven in a low frequency mode.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:
1. A display device comprising:
  pixels coupled to data lines and emission control lines;
  an auxiliary pixel coupled to an auxiliary data line and auxiliary emission control lines;
  a controller configured to:
    measure an auxiliary current supplied from the auxiliary pixel through an auxiliary line; and
    control a width of an emission start signal based on an accumulation amount of the auxiliary current; and
  an emission driver configured to, based on the emission start signal, supply emission control signals to the pixels and the auxiliary pixel through the emission control lines and the auxiliary emission control lines,
  wherein:
    the emission driver is configured to supply the emission control signals for each of a plurality of sub-periods of one frame period; and
    the controller is configured to change a width of the emission control signals for each of the plurality of sub-periods, and
  wherein the controller is configured to:
    store, as a comparison value, a maximum value of the accumulation amount of the auxiliary current during a first sub-period among the plurality of sub-periods;
    output a comparison result signal in response to the accumulation amount of the auxiliary current being equal to the comparison value during other sub-periods among the plurality of sub-periods, except the first sub-period;
    control the width of the emission start signal based on the comparison result signal; and
    output the emission start signal to the emission driver.
2. The display device of claim 1, wherein the controller is configured to increase the width of the emission control signals in correspondence with a supply order.
3. The display device of claim 1, further comprising a data driver configured to:
  supply data signals corresponding to gray levels to the data lines; and
  supply an auxiliary data signal corresponding to a determined voltage to the auxiliary data line.
4. The display device of claim 1, further comprising a scan driver configured to supply, for every one frame period, scan signals to scan lines coupled to the pixels and auxiliary scan lines coupled to the auxiliary pixel.

5. The display device of claim 1, wherein:
the controller further comprises an auxiliary transistor coupled between the auxiliary line and a start power source; and
the auxiliary transistor is turned on during each of the plurality of sub-periods.

6. The display device of claim 1, further comprising:
an auxiliary capacitor coupled between the auxiliary line coupled to the auxiliary pixel and an auxiliary power source,
wherein the auxiliary current flows from a first pixel power source to the auxiliary power source via the auxiliary capacitor.

7. The display device of claim 1, wherein the emission driver comprises a plurality of emission stage circuits configured to supply the emission control signals based on the emission start signal.

8. The display device of claim 7, wherein the plurality of emission stage circuits is configured to shift the emission start signal or the emission control signals.

9. A display device comprising:
pixels coupled to data lines and emission control lines;
an auxiliary pixel coupled to an auxiliary data line and auxiliary emission control lines;
a reference pixel coupled to an auxiliary data line and reference emission control lines;
a controller configured to:
  measure an auxiliary current supplied from the auxiliary pixel through an auxiliary line;
  measure a reference current supplied from the reference pixel through a reference line; and
  control a width of an emission start signal based on an accumulation amount of the auxiliary current and an accumulation amount of the reference current;
an emission driver configured to, based on the emission start signal, supply emission control signals to the pixels and the auxiliary pixel through the emission control lines and the auxiliary emission control lines; and
a reference pixel driver configured to supply a reference emission control signal to the reference pixel through the reference emission control line,
wherein the controller is configured to:
  compare a voltage of the auxiliary line with a voltage of the reference line;
  output a comparison result signal in response to the voltage of the auxiliary line being equal to the voltage of the reference line;
  control the width of the emission start signal based on the comparison result signal; and
  output the emission start signal to the emission driver.

10. The display device of claim 9, wherein:
the pixels and the auxiliary pixel are driven at a first frequency;
the reference pixel is driven at a second frequency; and
the first frequency is smaller than the second frequency.

11. The display device of claim 9, wherein:
the emission driver is configured to supply the emission control signals for each of a plurality of sub-periods of one frame period; and
the controller is configured to change a width of the emission control signals for each of the plurality of sub-periods.

12. The display device of claim 11, wherein the controller is configured to change the width of the emission control signals to increase in correspondence with a supply order.

13. The display device of claim 11, further comprising:
a scan driver configured to, for every one frame period, supply scan signals to scan lines coupled to the pixels and auxiliary scan lines coupled to the auxiliary pixel,
wherein the reference pixel driver is configured to supply reference scan signals to a reference scan line coupled to the reference pixel for each of the plurality of sub-periods.

14. The display device of claim 9, further comprising a data driver configured to:
supply data signals corresponding to gray levels to the data lines; and
supply an auxiliary data signal corresponding to a determined voltage to the auxiliary data line.

15. The display device of claim 9, further comprising:
an auxiliary capacitor coupled between the auxiliary line coupled to the auxiliary pixel and an auxiliary power source; and
a reference capacitor coupled between the reference line coupled to the reference pixel and the auxiliary power source,
wherein the auxiliary current flows from a first pixel power source to the auxiliary power source via the auxiliary capacitor, and
wherein the reference current flows from the first pixel power source to the auxiliary power source via the reference capacitor.

16. The display device of claim 9, wherein the emission driver comprises a plurality of emission stage circuits configured to supply the emission control signals based on the emission start signal.

17. The display device of claim 16, wherein the plurality of emission stage circuits are configured to shift the emission start signal or the emission control signals.

* * * * *